(12) United States Patent
Sohn et al.

(10) Patent No.: US 9,235,466 B2
(45) Date of Patent: Jan. 12, 2016

(54) MEMORY DEVICES WITH SELECTIVE ERROR CORRECTION CODE

(71) Applicant: Samsung Electronics Co., Ltd., Suwon-Si, Gyeonggi-Do (KR)

(72) Inventors: Young-Soo Sohn, Seoul (KR); Chul-Woo Park, Yongin-si (KR); Jong-Pil Son, Seongnam-si (KR); Jung-bae Lee, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 102 days.

(21) Appl. No.: 13/915,179

(22) Filed: Jun. 11, 2013

(65) Prior Publication Data

US 2014/0013183 A1    Jan. 9, 2014

Related U.S. Application Data

(60) Provisional application No. 61/667,779, filed on Jul. 3, 2012.

(30) Foreign Application Priority Data

Feb. 15, 2013 (KR) .......................... 10-2013-0016594

(51) Int. Cl.
*G06F 11/10* (2006.01)
*H03M 13/00* (2006.01)
*H03M 13/37* (2006.01)
*G11C 29/04* (2006.01)

(52) U.S. Cl.
CPC ............ *G06F 11/1012* (2013.01); *G06F 11/10* (2013.01); *G06F 11/106* (2013.01); *G06F 11/1024* (2013.01); *G06F 11/1048* (2013.01); *H03M 13/3707* (2013.01); *G11C 2029/0411* (2013.01)

(58) Field of Classification Search
CPC ............ G06F 11/1012; G06F 11/1024; G06F 11/1048; G06F 11/106; H03M 13/3707
USPC ......................................................... 714/773
See application file for complete search history.

(56) References Cited

U.S. PATENT DOCUMENTS

| | | | | |
|---|---|---|---|---|
| 4,225,941 | A * | 9/1980 | Moran | 710/307 |
| 4,394,763 | A * | 7/1983 | Nagano et al. | 714/6.1 |
| 4,939,694 | A * | 7/1990 | Eaton et al. | 365/200 |
| 5,602,987 | A * | 2/1997 | Harari et al. | 714/6.13 |
| 6,438,726 | B1 * | 8/2002 | Walters, Jr. | 714/764 |
| 7,304,893 | B1 * | 12/2007 | Hemink | 365/185.22 |
| 7,404,137 | B2 | 7/2008 | Lin et al. | |
| 8,151,163 | B2 * | 4/2012 | Shalvi et al. | 714/758 |
| 8,190,968 | B2 | 5/2012 | Lee et al. | |

(Continued)

FOREIGN PATENT DOCUMENTS

JP        2007141364 A     6/2007

*Primary Examiner* — Joseph D Torres
(74) *Attorney, Agent, or Firm* — Harness, Dickey & Pierce, P.L.C.

(57) ABSTRACT

An error correction apparatus includes an error correction circuit configured to selectively perform error correction on a portion of data that is at least one of written to and read from a plurality of memory cells of a memory device. The portion of data is at least one of written to and read from a subset of the plurality of memory cells, and the subset includes only fail cells among the plurality of memory cells. The error correction apparatus further includes a fail address storage circuit configured to store address information for the fail cells.

20 Claims, 26 Drawing Sheets

(56) References Cited

U.S. PATENT DOCUMENTS

| | | | |
|---|---|---|---|
| 8,599,611 B2* | 12/2013 | Shalvi et al. | 365/185.02 |
| 2007/0136640 A1* | 6/2007 | Jarrar | 714/763 |
| 2008/0002468 A1* | 1/2008 | Hemink | 365/185.17 |
| 2009/0144600 A1* | 6/2009 | Perlmutter et al. | 714/763 |
| 2009/0235145 A1* | 9/2009 | Ito et al. | 714/764 |
| 2012/0198297 A1* | 8/2012 | Kamigaichi et al. | 714/746 |
| 2013/0007564 A1 | 1/2013 | Bedeschi et al. | |
| 2013/0318418 A1* | 11/2013 | Bedeschi et al. | 714/758 |

* cited by examiner

MEMORY DEVICES WITH SELECTIVE ERROR CORRECTION CODE

CROSS-REFERENCE TO RELATED APPLICATIONS

This application claims priority to U.S. Provisional Application No. 61/667,779, filed on Jul. 3, 2012, in the USPTO and Korean Patent Application No. 10-2013-0016594, filed on Feb. 15, 2013, in the Korean Intellectual Property Office, the disclosures of which are incorporated herein in their entirety by reference.

BACKGROUND

1. Field

Example embodiments relate to semiconductor memory devices and memory systems, for example, memory devices capable of repairing a fail cell by performing selective error correction coding (ECC), and memory systems including the same.

2. Description of Conventional Art

Advancement in semiconductor manufacturing technology has resulted in an increase in the memory capacity of semiconductor memory devices. As microfabrication process technology has advanced, the number of fail memory cells has increased. When the number of fail cells increases, not only does production yield of semiconductor memory devices decrease, but memory capacity cannot be guaranteed. Methods of repairing fail cells may improve yield of semiconductor memory devices.

SUMMARY

Example embodiments provide memory devices capable of selectively performing error correction coding (ECC) only on fail cells, memory systems and electronic devices including the memory devices. Example embodiments also provide methods of operating semiconductor memory devices.

At least one example embodiment provides an error correction apparatus, comprising: an error correction circuit configured to selectively perform error correction on data written to and read from a subset of memory cells from among a plurality of memory cells of a memory device.

At least one other example embodiment provides an error correction apparatus, comprising: an error correction circuit configured to selectively perform error correction on a portion of data that is at least one of written to and read from a plurality of memory cells of a memory device.

At least one other example embodiment provides an error correction apparatus, comprising: an error correction circuit configured to determine whether a memory cell identified in a received command is a fail cell based on received address information associated with the received command and fail cell address information, the error correction circuit being further configured to perform error correction on data corresponding to the received command if the memory cell is a fail cell.

At least one other example embodiment provides an error correction apparatus, comprising: an error correction circuit configured to selectively perform error correction on memory cells among a row of memory cells of a memory cell array based on a comparison between a received row address and stored fail cell row addresses.

At least one other example embodiment provides a memory chip comprising: a memory cell array including a plurality of memory cells; and an error correction apparatus including an error correction circuit configured to selectively perform error correction on data written to and read from a subset of cells from among the plurality of memory cells.

At least one other example embodiment provides memory system comprising: a memory device including a cell array having a plurality of memory cells; a memory controller coupled to the memory device; and an error correction apparatus including an error correction circuit configured to selectively perform error correction on data written to and read from a subset of cells from among the plurality of memory cells.

At least one other example embodiment provides a memory chip comprising: a memory cell array including a plurality of memory cells; and an error correction apparatus including an error correction circuit configured to determine whether a memory cell identified in a received command is a fail cell based on received address information associated with the received command and fail cell address information, the error correction circuit being further configured to perform error correction on data corresponding to the received command if the memory cell is a fail cell.

At least one other example embodiment provides a memory system comprising: a memory device including a cell array having a plurality of memory cells; a memory controller coupled to the memory device; and an error correction apparatus including an error correction circuit configured to determine whether a memory cell identified in a received command is a fail cell based on received address information associated with the received command and fail cell address information, the error correction circuit being further configured to perform error correction on data corresponding to the received command if the memory cell is a fail cell.

At least one other example embodiment provides a memory system comprising: a memory cell array including a plurality of memory cells; and an error correction apparatus including an error correction circuit configured to selectively perform error correction on memory cells among a row of memory cells of the memory cell array based on a comparison between a received row address and stored fail cell row addresses.

At least one other example embodiment provides an error correction method comprising: selectively performing error correction on data written to and read from a subset of cells from among a plurality of cells of a memory device.

At least one other example embodiment provides an error correction method, comprising: selectively performing error correction on a portion of data that is at least one of written to and read from a plurality of memory cells of a memory device.

At least one other example embodiment provides an error correction method comprising: determining whether a memory cell identified in a received command is a fail cell based on received address information associated with the received command and fail cell address information; and performing error correction on data corresponding to the received command if the memory cell is a fail cell.

At least one other example embodiment provides an error correction method, comprising: selectively performing error correction on memory cells among a row of memory cells of a memory cell array based on a comparison between a received row address and stored fail cell row addresses.

BRIEF DESCRIPTION OF THE DRAWINGS

Example embodiments will be more clearly understood from the following detailed description taken in conjunction with the accompanying drawings in which.

DETAILED DESCRIPTION

Figure 1:
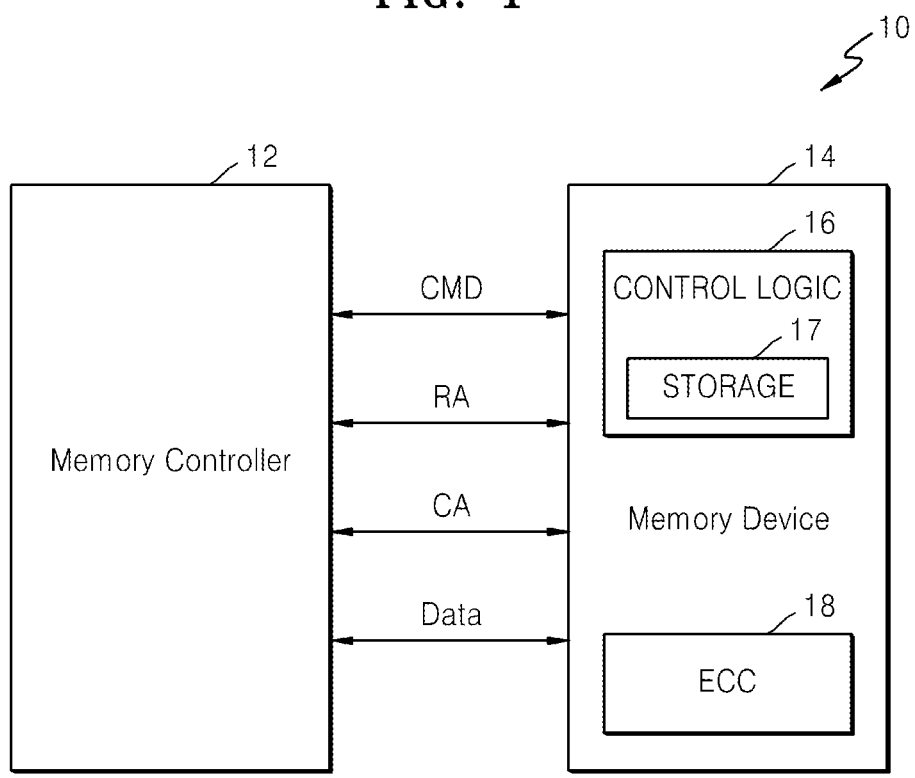
FIG. 1 is block diagram of an example embodiment of a memory system including a memory device for performing selective error correction coding (ECC)

Example embodiments will now be described more fully hereinafter with reference to the accompanying drawings, in which some example embodiments of inventive concepts are shown. However, example embodiments may be embodied in many different forms and should not be construed as limited to the embodiments set forth herein. Rather, these example embodiments are provided so that this disclosure will be thorough and complete, and will fully convey the scope of inventive concepts to those skilled in the art.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams in order not to obscure the example embodiments in unnecessary detail. In other instances, well-known processes, structures and techniques may be shown without unnecessary detail in order to avoid obscuring example embodiments.

Also, it is noted that example embodiments may be described as a process depicted as a flowchart, a flow diagram, a data flow diagram, a structure diagram, or a block diagram. Although a flowchart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, a function, a procedure, a subroutine, a subprogram, etc. When a process corresponds to a function, its termination may correspond to a return of the function to the calling function or the main function.

Moreover, as disclosed herein, the term "buffer," "memory" or the like, may represent one or more devices for storing data, including random access memory (RAM), magnetic RAM, core memory, and/or other machine readable mediums for storing information. The term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, and various other mediums capable of storing or containing instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

A code segment may represent a procedure, a function, a subprogram, a program, a routine, a subroutine, a module, a software package, a class, or any combination of instructions, data structures, or program statements.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items.

Advancement in semiconductor manufacturing technology has resulted in an increase in the memory capacity of semiconductor memory devices. As microfabrication process technology has advanced, the number of defective memory cells has increased. To secure yield, defective memory cells are repaired by being replaced with redundant memory cells. However, sufficient yield may not be achieved using only a redundant repair scheme. Thus, methods of repairing error bits by applying an error correction coding (ECC) algorithms in dynamic random access memory (DRAM) have been introduced.

ECC algorithms provide ECC operations to detect errors that may occur during writing/reading of data and to correct the detected errors. To provide data integrity, the DRAM may employ an ECC circuit or unit. An ECC circuit performs the ECC operation using parity bits during detection/correcting of errors. Thus, an additional memory region for storing the parity bits is needed for DRAM. As shown in Table 1, the more parity bits used to perform the ECC operation, the more data bits to be corrected, but the greater a chip-size overhead.

TABLE 1

| Data bit | Error bit | Parity bit | Chip-size overhead |
|---|---|---|---|
| 8 | 1 | 4 | 50% |
| 16 | 1 | 5 | 31% |
| 32 | 1 | 6 | 18% |
| 64 | 1 | 7 | 10% |
| 128 | 1 | 8 | 6% |

As shown in Table 1, an ECC operation performed in units of 64 data bits may result in a chip-size overhead of about 10%.

FIG. 1 is a block diagram of an example embodiment of a memory system 10.

Referring to FIG. 1, the memory system 10 includes a memory device 14 and a memory controller 12. The memory device 14 is configured to perform selective ECC. The memory controller 12 controls the memory device 14. More specifically, the memory controller 12 transmits control signals, such as a command CMD, a row address RA, and a column address CA, and data Data to the memory device 14, and receives data Data from the memory device 14.

The memory device 14 includes a control logic circuit 16 and an ECC circuit 18. The control logic circuit 16 includes a fail address storing circuit 17. The fail address storing circuit 17 stores fail addresses associated with fail memory cells included in the memory device 14. A fail memory cell may be a defective cell and/or a weak cell. A defective cell is a cell that is defective in terms of hardware, and a weak cell is a cell that is defective in terms of software. Examples of weak cells may be cells that deteriorate in terms of various device performances (e.g., a cell having a relatively short refresh duration, degraded write performance, variable retention time, etc.).

The fail address storing circuit 17 may store a fail address generated during a test of the memory device 14. The fail address storing circuit 17 may also store a fail address that is newly generated when the memory device 14 is mounted in the memory system 10. The fail address storing circuit 17 may update and store additional and later generated fail addresses. The fail address storing circuit 17 may be embodied as an anti-fuse array, a content addressable memory (CAM), a register, a memory (e.g., a static random access memory (SRAM)), etc. The fail address storing circuit 17 may be updated using electrical fuse programming. The electrical fuse may be an anti-fuse.

Still referring to FIG. 1, the ECC circuit 18 generates parity bits for only fail memory cells in the memory device 14. The ECC circuit 18 performs selective ECC to detect and correct errors in the fail memory cells using the parity bits.

Figure 2A:
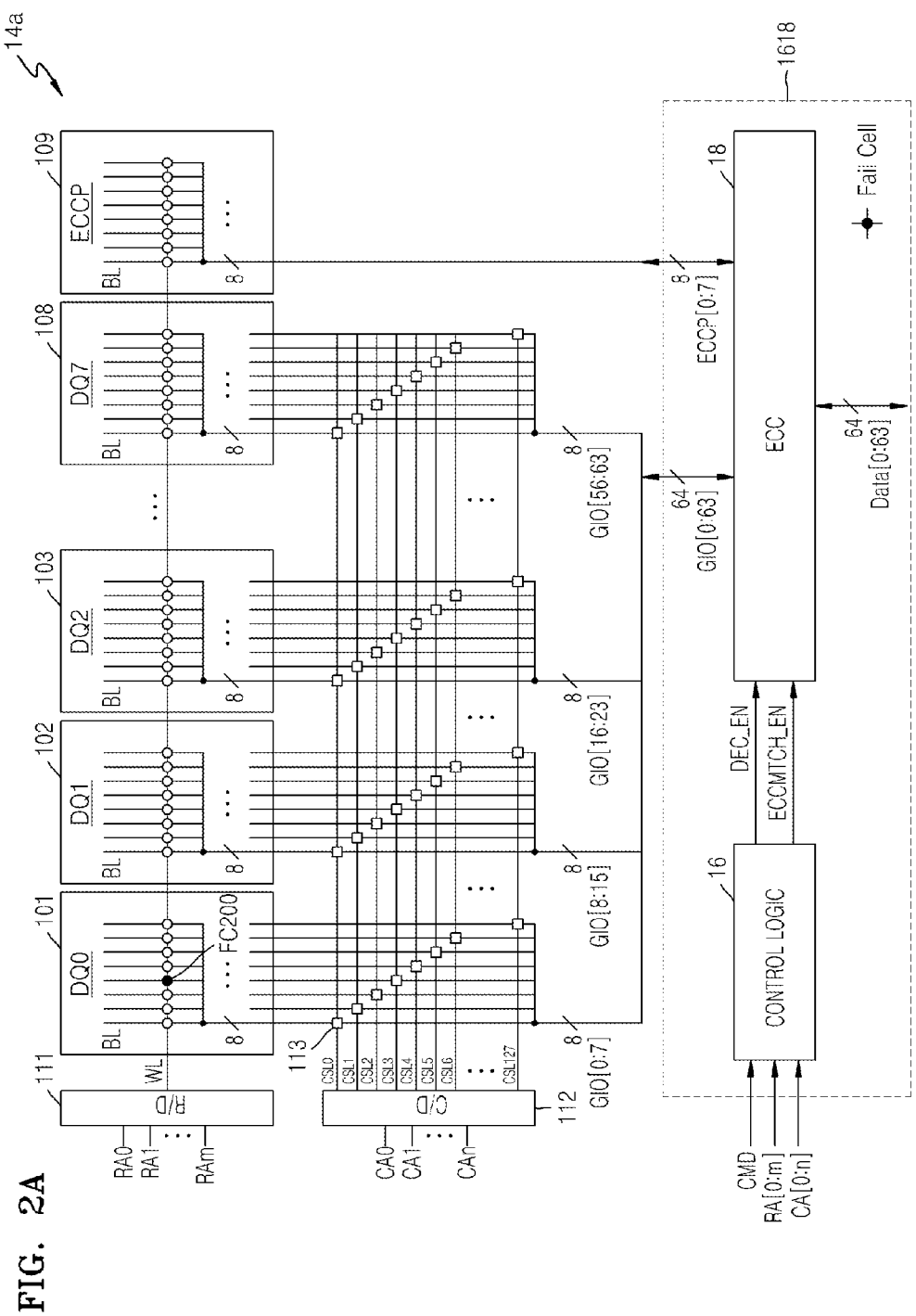
FIGS. 2A and 2B are block diagrams of memory devices according to example embodiments.
Figure 2B:
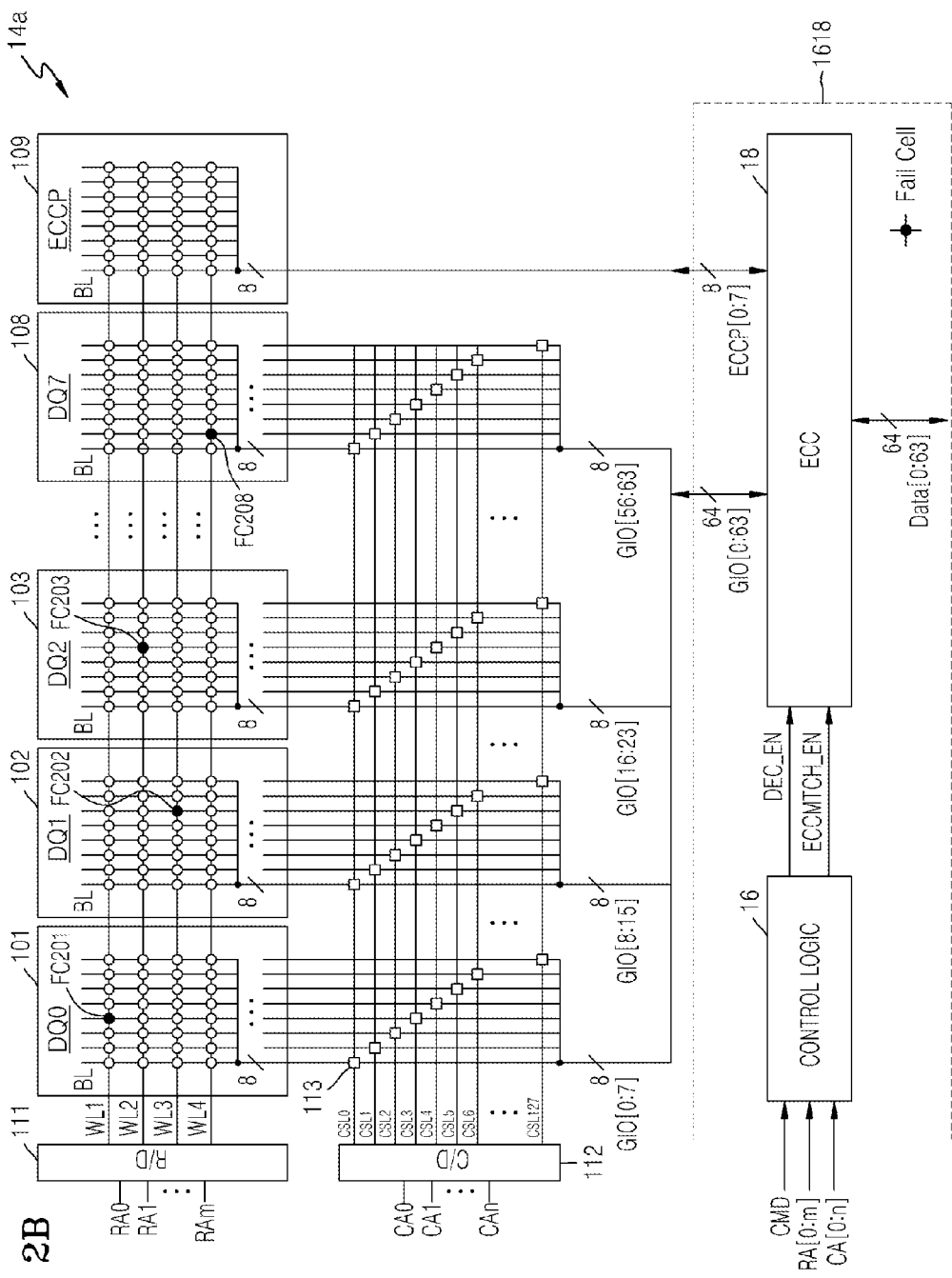

FIGS. 2A and 2B are block diagrams of memory devices according to example embodiments. The memory devices shown in FIGS. 2A and 2B may serve as the memory device 14 shown in FIG. 1.

Referring to FIG. 2A, the memory device 14a performs ECC operations, for example, in units of 64 bits. The memory device 14a includes a plurality of main memory cell blocks 101 to 108. The memory device 14a further includes an ECC memory cell block 109. The plurality of main memory cell blocks 101 to 108 are memory blocks that determine a memory capacity of the memory device 14a. In each of the plurality of main memory cell blocks 101 to 108, a plurality of memory cells are arrayed in a plurality of rows and columns. In the ECC memory cell block 109, a plurality of memory cells are arrayed in a plurality of rows and columns, similar to the plurality of main memory cell blocks 101 to 108.

Since data stored in the plurality of memory cells of the plurality of main memory cell blocks 101 to 108 is input and output via corresponding data input/output (I/O) pads DQ0 to DQ7, respectively, the plurality of main memory cell blocks 101 to 108 will be hereinafter referred to as 'DQ0 to DQ7 cell blocks 101 to 108' for convenience of explanation. Also, the ECC memory cell block 109 will be hereinafter referred to as 'ECC cell block 109'.

In the DQ0 to DQ7 cell blocks 101 to 108, the rows may be formed, for example, of 8K word lines WL and the columns may be formed, for example, of 1K bit lines BL. In at least one example embodiment, the memory cells arranged at the intersections of the word lines WL, and the bit lines BL may be DRAM cells. In the DQ0 to DQ7 cell blocks 101 to 108, the word lines WL are accessed according to row addresses RA0 to RAm, and the bit lines BL are accessed according to column addresses CA0 to CAn. The row addresses RA0 to RAm are decoded by a row decoder 111, and the word lines WL are selected based on the decoded row addresses RA0 to RAm.

A column decoder 112 selects bit lines BL based on the column addresses CA0 to CAn. In more detail, the column decoder 112 decodes the column addresses CA0 to CAn, and generates column selection signals CSL0 to CSL127 for selecting the bit lines BL based on the decoded column addresses CA0 to CAn. To support a burst length representing a maximum number of column locations to be accessed, bit lines BL corresponding to the burst length may be accessed simultaneously and/or concurrently.

In one example, the memory device 14a may be set such that the burst length is equal to '8'. The bit lines BL are connected to column selection circuits 113 to which the 128 column selection signals CSL0 to CSL127 are supplied, respectively. Each of the column selection circuits 113 may select eight bit lines BL simultaneously and/or concurrently. Each column selection circuit 113 includes eight switches that are turned on based on the column selection signals CSL0 to CSL127.

In the DQ0 cell block 101, the word line WL accessed according to the row addresses RA0 to RAm is connected to a plurality of memory cells. The column selection circuit 113 to which the column selection signal CSL0 is supplied selects eight memory cells among the plurality of memory cells connected to the word line WL. The selected memory cells are connected to first data lines GIO[0:7]. The first data lines GIO[0:7] include eight data lines, and may simultaneously and/or concurrently transmit eight bits.

Similarly, in the DQ1 cell block 102, the column selection circuit 113 to which the column selection signal CSL0 is supplied selects eight memory cells among the plurality of memory cells connected to the word line WL. The selected memory cells are connected to second data lines GIO[8:15].

In each of the other DQ2 to DQ7 cell blocks 103 to 108, a column selection circuit 113 to which the column selection signal CSL0 is supplied selects eight memory cells among the plurality of memory cells connected to the word line WL. The selected memory cells are connected to corresponding data lines among third to eighth data lines GIO[16:23] to [56:63]

Still referring to FIG. 2A, a plurality of pieces of Data[0:63] that are to be written to the DQ0 to DQ7 cell blocks 101 to 108 are provided to the memory device 14a via first to eighth data lines GIO[0:63]. In this example, the received 64-bit data Data[0:63] is written to eight memory cells of each of the DQ0 to DQ7 cell blocks 101 to 108 selected by the column selection circuit 113 to which the column selection signal CSL0 is supplied.

When a fail cell is present among memory cells that are included in the DQ0 to DQ7 cell blocks 101 to 108 and that are connected to the word line WL, the ECC cell block 109 is used to repair the fail cell. In the example shown in FIG. 2A, a fail cell FC200 (indicated with '●') is present in the DQ0 cell block 101 among memory cells of the DQ0 to DQ7 cell blocks 101 to 108 connected to the word line WL. However, example embodiments are not limited thereto, and the fail cell (indicated with '●') may be among the memory cells of the DQ1-DQ7 cell blocks 102 to 108 connected to the word line WL. The ECC cell block 109 is controlled by an error correction circuit 1618, and is used to detect and correct a fail cell in any of the DQ0 to DQ7 cell blocks 101 to 108. The error correction circuit 1618 may be part of or referred to as an error correction apparatus.

The ECC cell block 109 includes 8K word lines, similar to the DQ0 to DQ7 cell blocks 101 to 108, but includes only eight bit lines. In this example, the memory cells connected to intersections of word lines WL and bit lines BL in the ECC cell block 109 are also DRAM cells. In the ECC cell block 109, eight bit lines BLs are connected to parity data lines ECCP[0:7]. Parity bits associated with data Data[0:63] stored in a fail cell of any of the DQ0 to DQ7 cell blocks 101 to 108 are stored in, and read from, eight memory cells in the ECC cell block 109 via the parity data lines ECCP[0:7]. In this case, the eight memory cells of the ECC cell block 109 are connected to the same word line WL as the fail cell FC200.

Still referring to FIG. 2A, the error correction circuit 1618 includes a control logic circuit 16 and an ECC circuit 18.

The control logic circuit 16 receives a command CMD instructing the ECC circuit to perform a read/write operation, and the row addresses RA0 to RAm and the column addresses CA0 to CAn associated with the command CMD, from the memory controller 12 of FIG. 1. The control logic circuit 16 compares the received row addresses RA0 to RAm and column addresses CA0 to CAn with the addresses of fail cells stored in the fail address storing circuit 17 of FIG. 1. If the result of the comparison reveals that the addresses of fail cells are the same as (match) the accessed row addresses RA0 to RAm and column addresses CA0 to CAn, then the control logic circuit 16 generates an ECC match signal ECC-MTCH_EN. Also, the control logic circuit 16 generates an ECC instruction signal DEC_EN. The ECC instruction signal DEC_EN instructs the ECC circuit 18 to perform ECC decoding and/or ECC encoding according to the command CMD.

In one example, if the command CMD is a read command for a read operation, then the control logic circuit 16 generates an ECC instruction signal DEC_EN that is logic 'high' to instruct the ECC circuit 18 to perform ECC decoding. If the command CMD is a write command for a write operation, then the control logic circuit 16 generates an ECC instruction signal DEC_EN that is logic 'low' to instruct the ECC circuit 18 to perform ECC encoding.

The ECC circuit 18 detects and corrects fail cells in the DQ0 to DQ7 cell blocks 101 to 108 based on the ECC instruction signal DEC_EN and the ECC match signal ECC-MTCH_EN from the control logic circuit 16.

For example, during a write operation, the ECC circuit 18 generates parity bits associated with write data Data[0:63] received from the memory controller 12, and outputs the parity bits to the parity data lines ECCP[0:7] in response to the ECC match signal ECCMTCH_EN. The parity bits output to the parity data lines ECCP[0:7] are stored in the memory cells of the ECC cell block 109 that are connected to the same word line WL as the fail cell FC200.

During a read operation, in response to the ECC match signal ECCMTCH_EN, the ECC circuit 18 receives/obtains pieces of data via the first to eighth data lines GIO[0:63], and pieces of data via the parity data lines ECCP[0:7]. The pieces of data received via the first to eighth data lines GIO[0:63] are pieces of data stored in the memory cells of the DQ0 to DQ7 cell blocks 101 to 108 connected to the same word line WL as the fail cell FC200. The pieces of data delivered via the parity data lines ECCP[0:7] are parity bits stored in the memory cells of the ECC cell block 109 that are connected to the same word line WL as the fail cell FC200.

Based on the data received via the first to eighth data lines GIO[0:63] and the parity data lines ECCP[0:7], the ECC circuit 18 generates syndrome data, calculates the location of the fail cell FC200 (e.g., the location of an error bit), corrects data corresponding to the location of the error bit, and outputs error-corrected data Data[0:63].

FIG. 2A illustrates an example in which one fail cell FC200 (indicated with '●') is present in the DQ0 cell block. In this example, parity data regarding data Data[0:63] to be written to the memory cells including the fail cell FC200 is generated and stored in the memory cells of the ECC cell block 109 connected to the word line WL.

A fail cell may occur in memory cells connected to other word lines WL among the memory cells of the DQ0 to DQ7 cell blocks 101 to 108 selected by the column selection circuit 113 to which the column selection signal CSL0 is supplied. In this case, as illustrated in FIG. 2B, the memory device 14a detects and corrects error bits for fail cells in DQ0 to DQ7 cell blocks 101 to 108.

Referring to FIG. 2B, in this example a fail cell (indicated with '●') is present in each of the DQ0 to DQ7 cell blocks 101 to 108. In this case, only one fail cell is present on each of word lines WL1 through WL4. More specifically, in DQ0 cell block 101 the fail cell FC201 is present on the first word line WL1. In DQ1 cell block 102 the fail cell FC202 is present on the third word line WL3. In DQ2 cell block 103 the fail cell FC203 is present on the second word line WL2. In DQ7 cell block 108 the fail cell FC208 is present on the fourth word line WL4. Each of the fail cells FC201 through FC208 is selected via a bit line BL connected to the column selection circuit 113 to which column selection circuit CSL0 is input.

In the memory device 14a of FIG. 2B, parity bits associated with data Data[0:63] to be written to memory cells connected to the first word line WL1 in the DQ0 cell block 101 are stored in memory cells of the ECC cell block 109 connected to the first word line WL1.

Parity bits associated with data Data[0:63] to be written to memory cells connected to the third word line WL3 in the DQ1 cell block 102 are stored in memory cells of the ECC cell block 109 connected to the third word line WL3.

Parity bits associated with data Data[0:63] to be written to memory cells connected to the second word line WL2 in the DQ2 cell block 103 are stored in memory cells of the ECC cell block 109 connected to the second word line WL2.

Parity bits associated with data Data[0:63] to be written to memory cells connected to the fourth word line WL4 in the DQ7 cell block 108 are stored in memory cells of the ECC cell block 109 connected to the fourth word line WL4.

During a write operation, the memory device 14a generates parity bits associated with data stored in each memory cell in the DQ0 to DQ7 cell blocks 101 to 108 that are connected to the same word line as the corresponding fail cell. The memory device 14a stores the parity bits in memory cells of the ECC cell block 109 that are connected to corresponding ones of the first to fourth word lines WL1 to WL4.

Still referring to FIG. 2B, during a read operation the memory device 14a detects and corrects error bits in fail cell FC201 in DQ0 cell block 101 based on read data output to the first data line GIO[0:7] and parity bit data output to the parity data lines ECCP[0:7] from memory cells of the ECC cell block 109 connected to the first word line WL1.

The memory device 14a detects and corrects error bits in fail cell FC202 in DQ1 cell block 102 based on read data output to the data lines GIO[8:15] and parity bit data output to the parity data lines ECCP[0:7] from memory cells of the ECC cell block 109 connected to the third word line WL3.

The memory device 14a detects and corrects error bits in fail cell FC203 in DQ2 cell block 103 based on read data output to the data lines GIO[16:23] and parity bit data output to the parity data lines ECCP[0:7] from memory cells of the ECC cell block 109 connected to the second word line WL2.

The memory device 14a detects and corrects error bits in fail cell FC208 in DQ7 cell block 108 based on read data output to the data lines GIO[56:63] and parity bit data output to the parity data lines ECCP[0:7] from memory cells of the ECC cell block 109 connected to the fourth word line WL4.

Figure 3:
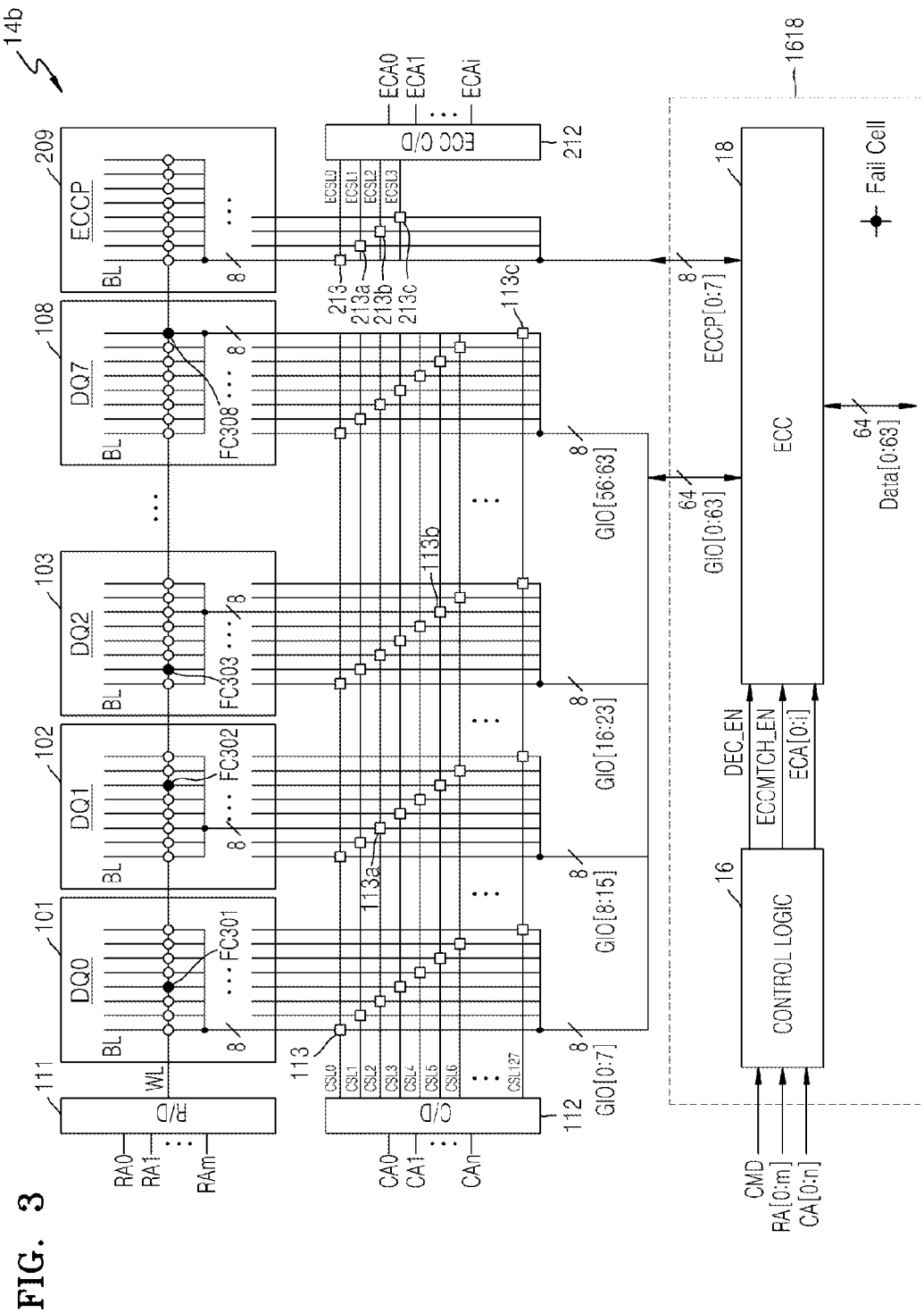
FIG. 3 is a block diagram of a memory device according to another example embodiment.

FIG. 3 is a block diagram of a memory device 14b according to another example embodiment. The memory device 14b is configured to correct errors of 2-bits or more when at least two fail cells are connected to a same word line.

Referring to FIG. 3, the memory device 14b is similar to the memory device 14a shown in FIGS. 2A and 2B, except that in that the ECC cell block 209 in FIG. 3 includes thirty-two bit lines BL. According to at least some example embodiments, the ECC cell block 209 in FIG. 3 may include (1K-8) bit lines BL when the number of bit lines BL included in a DQ0 cell block 101 is 1K. In this regard, the number of bit lines BL included in the ECC cell block 209 is less than the number of bit lines BL included in each of DQ0 to DQ7 cell blocks 101 to 108. Reference numerals in FIG. 3 that are the same as those in FIG. 2 denote the same elements, and thus, they are not described again in detail.

The memory device 14b also differs from the memory device 14a in that the memory device 14b further includes ECC column selection circuits 213, 213a, 213b and 213c and an ECC column decoder 212.

The bit lines BL included in the ECC cell block 209 are connected to respective ones of the ECC column selection circuits 213 to 213c. The ECC column decoder 212 outputs ECC column selection signals ECSL0 to ECSL3 to respective ones of the ECC column selection circuits 213 to 213c based on ECC column addresses ECA0 to ECAi from the control logic circuit 16. In this example, the ECC column decoder 212 decodes ECC column addresses ECA0 to ECAi from the control logic circuit 16 and outputs the ECC column selection signals ECSL0 to ECSL3 based on the decoded column addresses ECA0 to ECAi.

In the example embodiment shown in FIG. 3, the ECC column selection circuits 213 to 213c may select eight bit lines BL concurrently and/or simultaneously. Each of the ECC column selection circuits 213 through 213c may include eight switches. The ECC column selection circuits 213 through 213c are turned on according to the ECC column selection signals ECSL0 to ECSL3.

In the example shown in FIG. 3, the memory device 14b includes four fail cells FC301, FC302, FC303, FC308 connected to the word line WL accessed based on a row address RA[0:m]. In this example, each of the fail cells FC301, FC302, FC303 and FC308 is accessed in response to a different one of the column selection circuits 113 to 113c. More specifically, the fail cell FC301 (indicated with '●') is selected by the column selection circuit 113 in response to column selection signal CSL0, the fail cell FC302 (indicated with '●') is selected by the column selection circuit 113a in response to column selection signal CSL2, the fail cell FC303 (indicated with '●') is selected by the column selection circuit 113b based on a column selection signal CSL5, and the fail cell FC308 (indicated with '●') is selected by the column selection circuit 113c based on column selection signal CSL127.

In the example shown in FIG. 3, the ECC cell block 209 may detect and correct 4-bit errors so as to repair the four fail cells FC301, FC302, FC303, FC308. That is, the ECC cell block 209 may detect and correct 4-bit errors in the DQ0 to DQ7 cell blocks 101 to 108.

Although an example in which the memory device 14b includes four fail cells will be described, example embodiments are not limited to this example. Rather, the memory device 14b may include any number of fail cells.

Still referring to FIG. 3, during a write operation, when pieces of 64-bit write data Data[0:63] to be stored in memory cells connected to the word line WL and the column selection circuit 113 are received, the ECC circuit 18 generates parity bits associated with the pieces of write data Data[0:63], and outputs the parity bits to parity data lines ECCP[0:7]. The parity bits output to the parity data lines ECCP[0:7] are stored in memory cells of the ECC cell block 209 connected to the word line WL and the column selection circuit 213.

When pieces of 64-bit write data Data[0:63] to be stored in memory cells of the DQ0 to DQ7 cell blocks 101 to 108 connected to the word line WL and the column selection circuit 113a are received, the ECC circuit 18 generates parity bits associated with the pieces of write data Data[0:63]. The parity bits are stored in memory cells of the ECC cell block 209 connected to the word line WL and the column selection circuit 213a.

When pieces of 64-bit write data Data[0:63] to be stored in memory cells of the DQ0 to DQ7 cell blocks 101 to 108 connected to the word line WL and the column selection circuit 113b are received, the ECC circuit 18 generates parity bits associated with the pieces of write data Data[0:63]. The parity bits are stored in memory cells of the ECC cell block 209 connected to the word line WL and the column selection circuit 213b.

When pieces of 64-bit write data Data[0:63] to be stored in memory cells of the DQ0 to DQ7 cell blocks 101 to 108 connected to the word line WL and the column selection circuit 113c are received, the ECC circuit 18 generates parity bits associated with the pieces of write data Data[0:63]. The parity bits are stored in memory cells of the ECC cell block 209 connected to the word line WL and the column selection circuit 213c.

When reading 64-bit data stored in memory cells of the DQ0 to DQ7 cell blocks 101 to 108 connected to the word line WL and the column selection circuit 113, 8-bit parity data stored in memory cells connected to the word line WL and the ECC column selection circuit 213 are also read and output to the ECC circuit 18. The ECC circuit 18 detects the location of an error bit in the fail cell FC301, and corrects the error bit by inverting a logic value thereof.

When reading 64-bit data stored in memory cells connected to the word line WL and the column selection circuit 113a, 8-bit parity data stored in memory cells connected to the word line WL and the ECC column selection circuit 213a are read and output to the ECC circuit 18. The ECC circuit 18 detects the location of an error bit in the fail cell FC302, and corrects the error bit by inverting a logic value thereof.

When reading 64-bit data stored in memory cells connected to the word line WL and the column selection circuit 113b, 8-bit parity data stored in memory cells connected to the word line WL and the ECC column selection circuit 213b are read and output to the ECC circuit 18. The ECC circuit 18 detects the location of an error bit in a fail cell FC303, and corrects the error bit by inverting a logic value thereof.

When reading 64-bit data stored in memory cells connected to the word line WL and the column selection circuit 113c, 8-bit parity data stored in memory cells connected to the word line WL and the ECC column selection circuit 213c are read and output to the ECC circuit 18. The ECC circuit 18 detects the location of an error bit in the fail cell FC308, and corrects the error bit by inverting a logic value thereof.

According to at least some example embodiments, the ECC circuit 18 may detect the location of a 4-bit error (4 error bits) caused by fail cells included in the DQ0 to DQ7 cell blocks 101 to 108, correct the errors, and then output error-corrected data Data[0:63].

Figure 4:
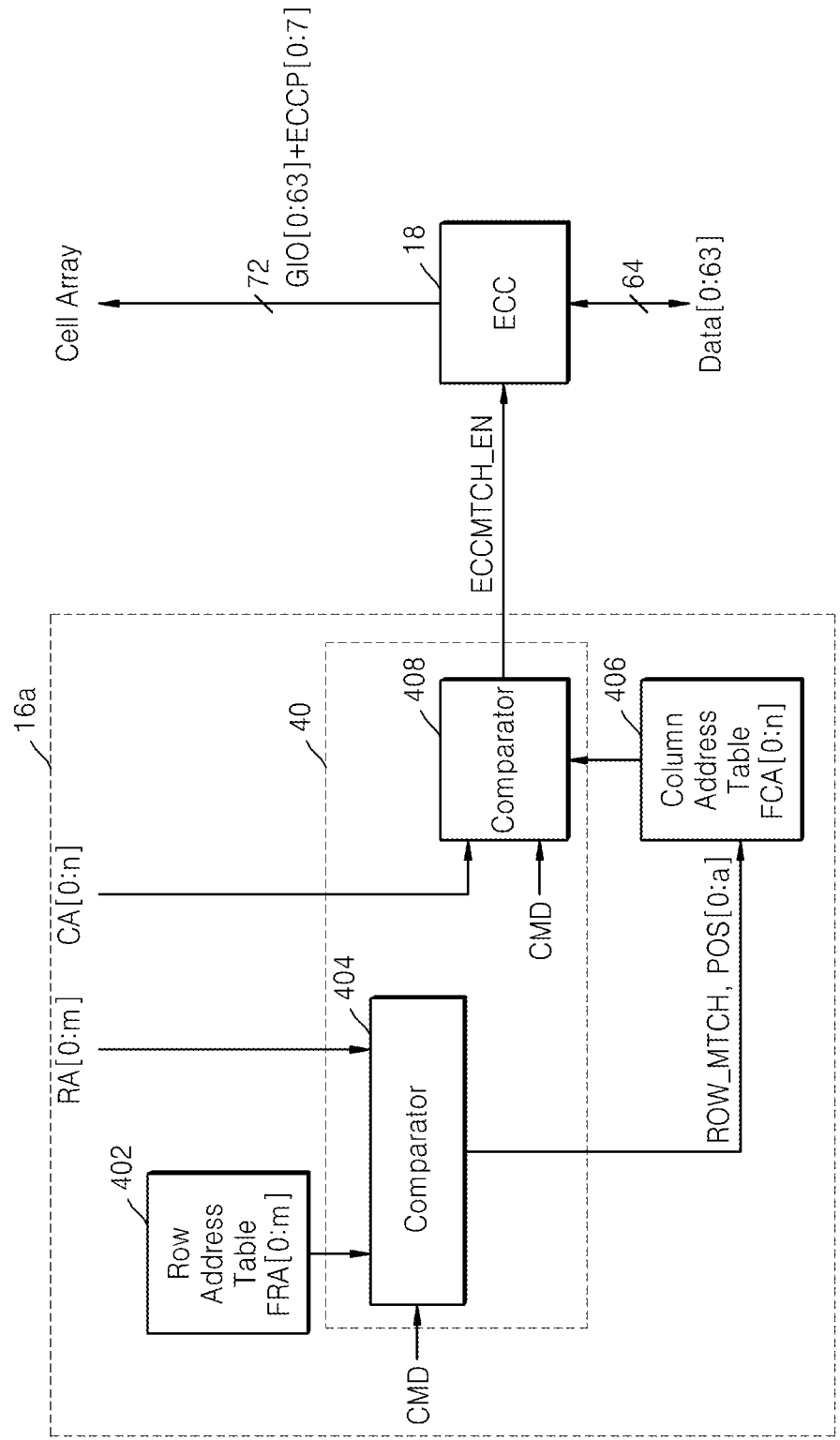
FIG. 4 is a diagram illustrating a control logic circuit according to an example embodiment.

FIG. 4 is a diagram illustrating an example embodiment of a control logic circuit 16a, such as those shown in FIGS. 2A and 2B.

Referring to FIG. 4, the control logic circuit 16a includes a row address storing circuit 402, a comparator circuit 40, and a column address storing circuit 406. The row address storing circuit 402 stores row addresses FRA[0:m] of fail cells (fail cell row addresses). The column address storing circuit 406 stores column addresses FCA[0:n] of the fail cells (fail cell column addresses).

The comparator circuit 40 outputs the ECC match signal ECCMTCH_EN to the ECC circuit 18 based on a comparison between fail cell address information and received address information. In this example, the fail cell address information includes fail cell row addresses FRA[0:m] and fail cell column addresses FCA[0:n]. The received address information includes received row addresses RA[0:m] and received column addresses CA[0:n].

In more detail, the comparator circuit 40 includes a first comparator 404 and a second comparator 408.

The first comparator 404 receives the command CMD (e.g., a read/write command) and a row address RA[0:m] associated with the command CMD from the memory controller 12 of FIG. 1. The first comparator 404 compares the fail cell row addresses FRA[0:m] stored in the row address storing circuit 402 with the received row address RA[0:m]. The first comparator 404 generates a row match signal ROW_MTCH and a column address position signal POS[0:a] for a corresponding fail cell based on the comparison, and outputs the row match signal ROW_MTCH and the column address position signal POS[0:a] to the column address storing circuit 406.

The column address storing circuit 406 provides a fail cell column address FCA[0:n] corresponding to the column address position signal POS[0:a] to the second comparator 408 in response to the row match signal ROW_MTCH. The second comparator 408 receives a column address CA[0:n] associated with the command CMD, and compares the fail cell column address FCA[0:n] from the column address storing circuit 406 with the received column address CA[0:n]. The second comparator 408 generates an ECC match signal ECCMTCH_EN based on the comparison. The second comparator 408 outputs the ECC match signal ECCMTCH_EN to the ECC circuit 18

During a write operation, in response to the ECC match signal ECCMTCH_EN the ECC circuit 18 generates parity bits associated with write data Data[0:63]. The ECC circuit 18 stores the write data Data[0:63] in a cell array block (e.g., including the DQ0 to DQ7 cell blocks 101 to 108) via first to eighth data lines GIO[0:63], and stores and the parity bits in the ECC cell block 109 via parity data lines ECCP[0:7].

During a read operation, in response to the ECC match signal ECCMTCH_EN the ECC circuit 18 generates syndrome data based on data output to the first to eighth data lines GIO[0:63] from the cell array block including the DQ0 to DQ7 cell blocks 101 to 108 and the parity data lines ECCP[0:7] from the ECC cell block 109. The ECC circuit 18 also determines the location of a fail cell (e.g., the location of an error bit), corrects data corresponding to the location of the error bit, and outputs error-corrected data Data[0:63].

Figure 5:
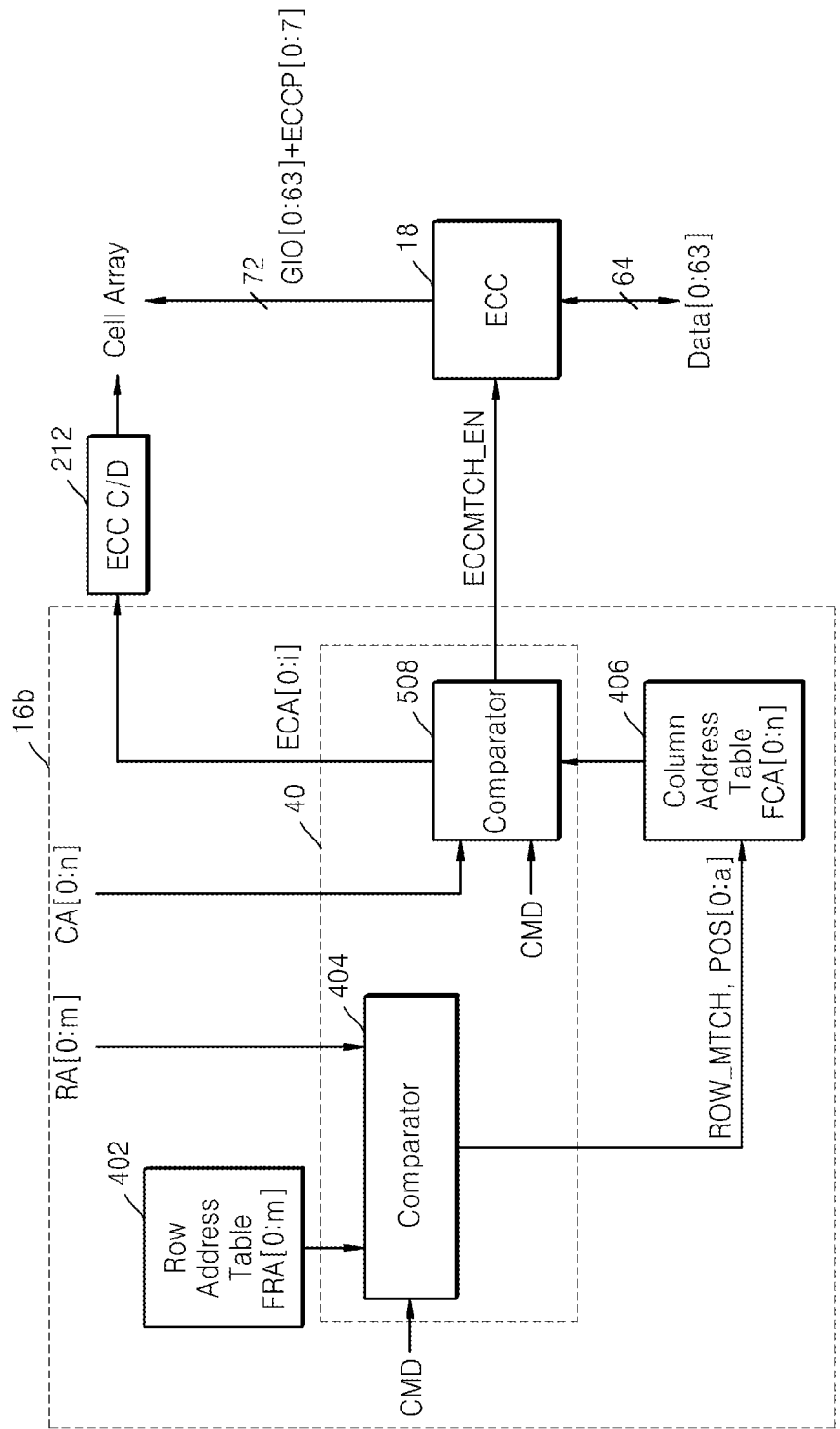
FIG. 5 is a diagram illustrating a control logic circuit according to another example embodiment.

FIG. 5 is a diagram illustrating an example embodiment of a control logic circuit 16b, such as that shown in FIG. 3.

Referring to FIG. 5, the control logic circuit 16b is similar to the control logic circuit 16a in FIG. 4, except in that the comparator circuit 40' includes a second comparator 508 that compares a fail cell column address FCA[0:n] with a received column address CA[0:n] and generates an ECC match signal ECCMTCH_EN and an ECC column address ECA[0:i] based on the comparison. In FIG. 5, reference numerals that are the same as those in FIG. 4 denote the same elements, and thus, they are not described again here.

Referring back to FIG. 3, four fail cells are present among memory cells in the DQ0, DQ1, DQ2, and DQ7 cell blocks 101, 102, 103, and 108 connected the word line WL and the column selection circuits 113, 113a, 113b, and 113c. Accordingly, four fail cell column addresses FCA[0:n] are present for one fail cell row address FRA[0:m]. In this case, the fail cell row address FRA[0:m] is the row address RA[0:m] corresponding to the word line WL.

In this example, the first comparator 404 compares the fail cell row addresses FRA[0:m] stored in the row address storing circuit 402 with the received row address RA[0:m], and generates a row match signal ROW_MTCH and column address position signals POS[0:a] for the four fail cells based on the comparison.

The second comparator 508 compares the four fail cell column addresses FCA[0:n] from the column address storing circuit 406 with a received column address CA[0:n], and generates an ECC match signal ECCMTCH_EN and an ECC column address ECA[0:i] based on the comparison. The ECC match signal ECCMTCH_EN is transmitted to the ECC circuit 18.

During a write operation, the ECC circuit 18 generates parity bits associated with data Data[0:63] to be written to memory cells including the fail cells in the DQ0 to DQ7 cell blocks 101 to 108. During a read operation, the ECC circuit 18 corrects error bit data based on data read from the memory cells including fail cells via first to eighth data lines GIO[0:63] and parity bits delivered to parity data lines ECCP[0:7], and outputs error-corrected data Data[0:63].

Still referring to FIGS. 3 and 5, the second comparator 508 outputs the ECC column address ECA[0:i] to the ECC column decoder 212, and the ECC column decoder 212 decodes the ECC column address ECA[0:i] to generate ECC column selection signals ECSL0 to ECSL3. The ECC column decoder 212 outputs the ECC column selection signals ECSL0 to ECSL3 to the ECC column selection circuits 213 through 213c to select memory cells of the ECC cell block 209 to store the parity bits associated with the data Data[0:63] to be written to the memory cells including the fail cells in the DQ0 to DQ7 cell blocks 101 to 108.

Figure 6A:
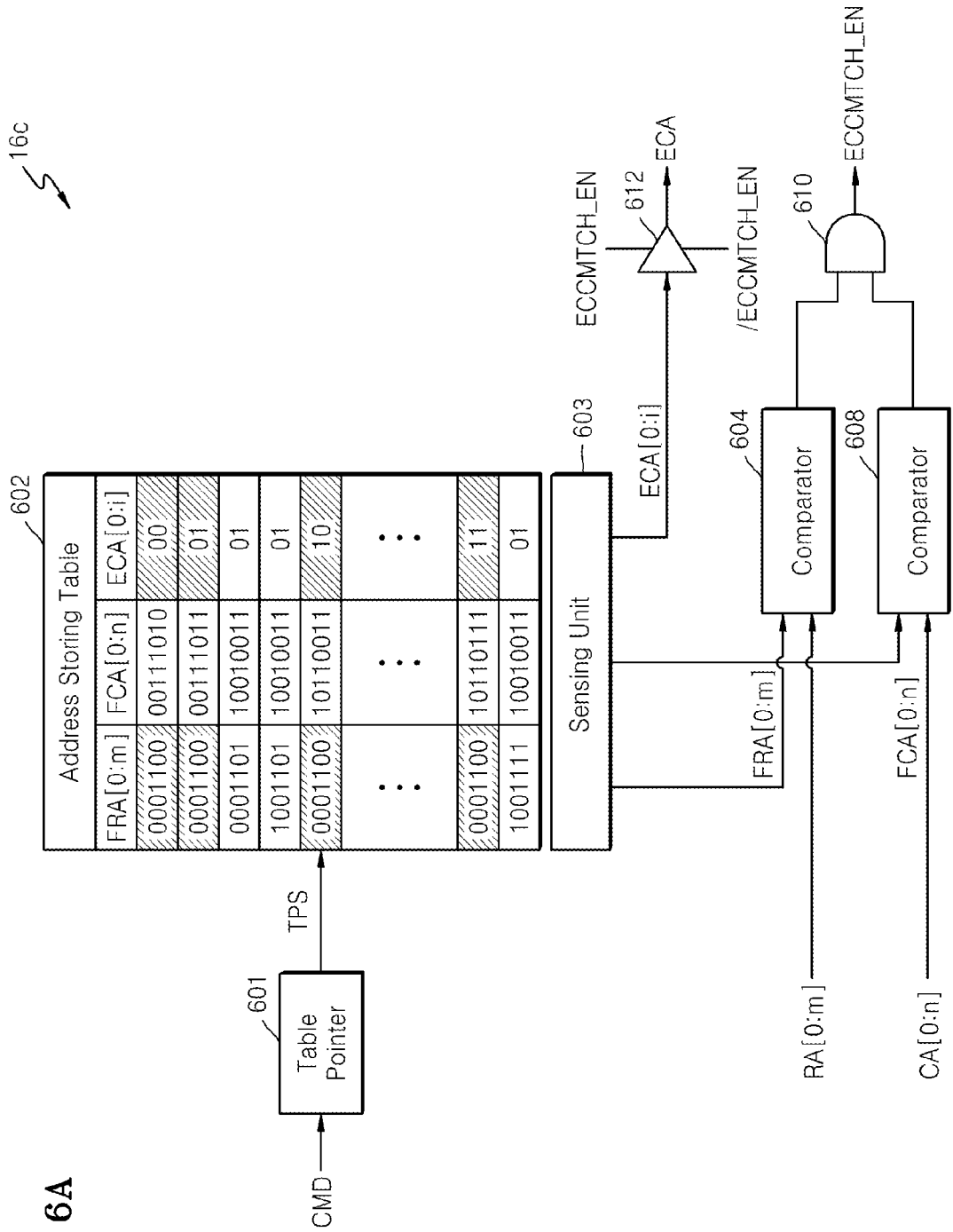
FIG. 6A is a diagram illustrating a control logic circuit according to yet another example embodiment.

FIG. 6A is a diagram illustrating another example embodiment of a control logic circuit 16c.

Referring to FIG. 6A, the control logic circuit 16c includes a table pointer 601, an address storing table 602, a sensing circuit 603, first and second comparators 604 and 608, a logic circuit 610, and a buffer 612. The table pointer 601 generates a pointer signal TPS according to a command CMD (e.g., a read/write command) received from the memory controller 12 of FIG. 1. The pointer signal TPS provides location information for the address storing table 602.

The address storing table 602 stores fail cell row addresses FRA[0:m], fail cell column addresses FCA[0:n], and ECC column addresses ECA[0:i]. According to at least some example embodiments, the address storing table 602 may be embodied as an anti-fuse array or a content addressable memory (CAM).

The sensing circuit 603 outputs a fail cell row address FRA[0:m], a fail cell column address FCA[0:n], and the ECC column address ECA[0:i] stored in a location (indicated by the pointer signal TPS) in the address storing table 602 based on the pointer signal TPS from the table pointer 601.

The first comparator 604 compares the fail cell row address FRA[0:m] from the address storing table 602 with a row address RA[0:m] associated with the command CMD. When a result of the comparison reveals that the fail cell row address FRA[0:m] and the received row address RA[0:m] are the same (match), the first comparator 604 outputs a first comparison signal COMP1 that is logic 'high'.

The second comparator 608 compares the fail cell column address FCA[0:n] received from the address storing table 602 with a column address CA[0:n] associated with the command CMD. When a result of the comparison reveals that the fail cell column address FCA[0:n] and the received column address CA[0:n] are the same, the second comparator 608 outputs a second comparison signal COMP2 that is logic 'high'.

The logic circuit 610 performs an AND operation on the first comparison signal COMP1 and the second comparison signal COMP2 to generate an ECC match signal ECCMTCH_EN. In one example, the logic circuit 610 generates the ECC match signal ECCMTCH_EN having a logic 'high' when the first comparison signal COMP1 and the second comparison signal COMP2 are logic 'high'. The buffer 612 outputs an ECC column address ECA[0:i] received from the address storing table 602 in response to the ECC match signal ECCMTCH_EN.

Figure 6B:
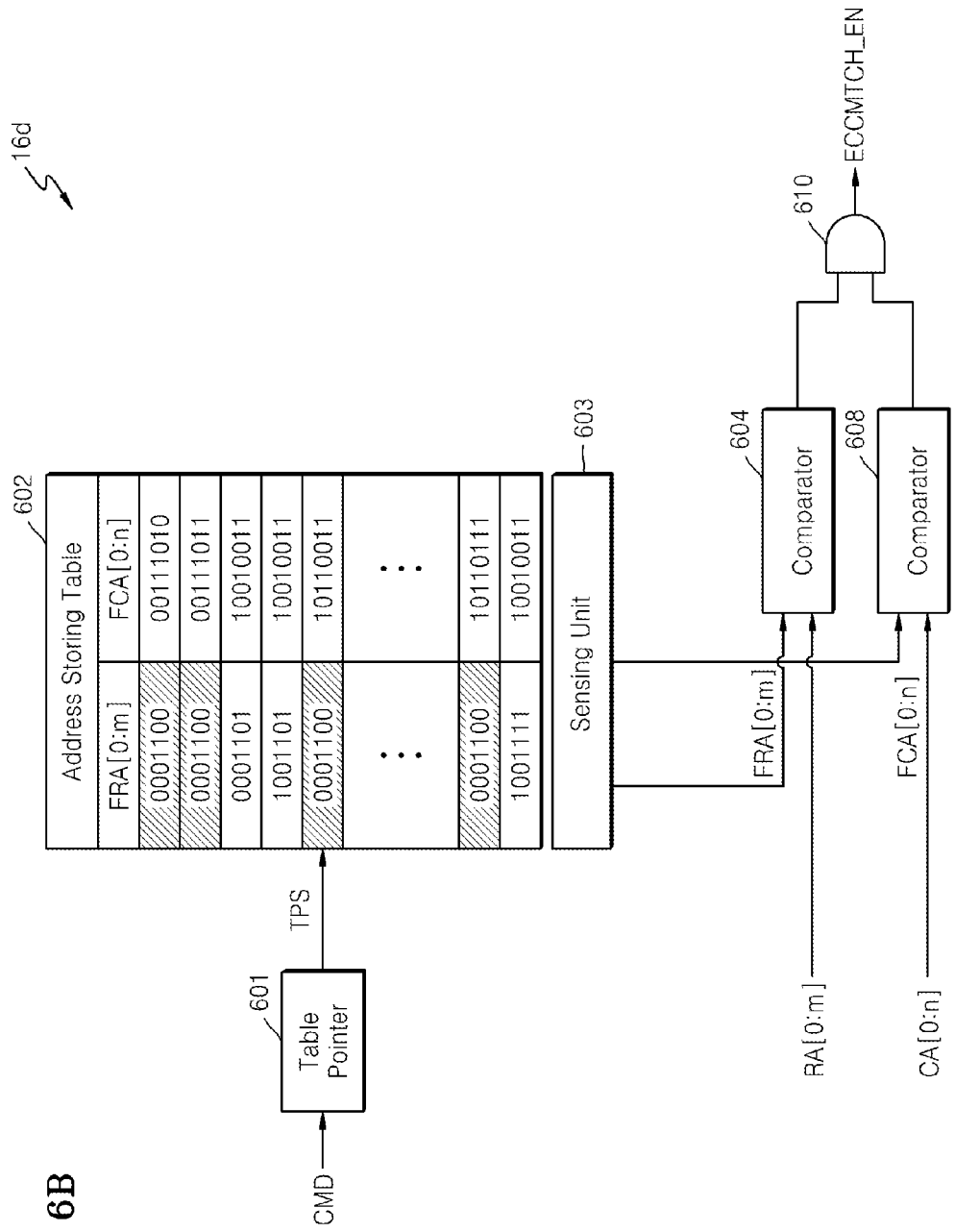
FIG. 6B is a diagram illustrating a control logic circuit according to still another example embodiment.

FIG. 6B is a diagram illustrating another example embodiment of the control logic circuit 16d.

Referring to FIG. 6B, the control logic circuit 16d is similar to the control logic circuit 16c, except that control logic circuit 16d does not include the buffer 612, and the address storing table 602' does not store ECC column addresses ECA[0:i].

In this example, the sensing circuit 603 outputs a fail cell row address FRA[0:m] and a fail cell column address FCA[0:n] based on the pointer signal TPS from the table pointer 601.

The first comparator 604 compares the fail cell row address FRA[0:m] from the address storing table 602' with a row address RA[0:m] associated with the command CMD. When a result of the comparison reveals that the fail cell row address FRA[0:m] and the received row address RA[0:m] are the same (match), the first comparator 604 outputs a first comparison signal COMP1 that is logic 'high'.

The second comparator 608 compares the fail cell column address FCA[0:n] received from the address storing table 602' with a column address CA[0:n] associated with the command CMD. When a result of the comparison reveals that the fail cell column address FCA[0:n] and the received column address CA[0:n] are the same, the second comparator 608 outputs a second comparison signal COMP2 that is logic 'high'.

The logic circuit 610 performs an AND operation on the first comparison signal COMP1 and the second comparison signal COMP2 to generate an ECC match signal ECCMTCH_EN. In one example, the logic circuit 610 generates the ECC match signal ECCMTCH_EN having a logic 'high' when the first comparison signal COMP1 and the second comparison signal COMP2 are logic 'high'.

Figure 7:
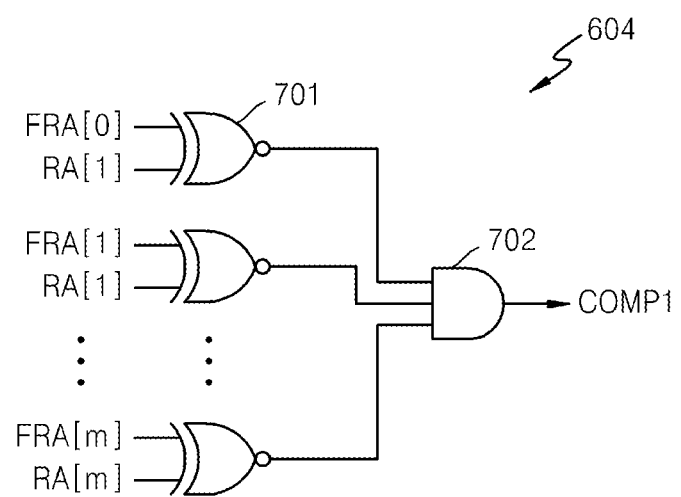
FIG. 7 is a diagram illustrating an example embodiment of the first comparator shown in FIG. 6A.

FIG. 7 is a diagram illustrating an example embodiment of the first comparator 604 shown in FIGS. 6A and 6B.

Referring to FIG. 7, the first comparator 604 includes XNOR gates 701 that compare bits of fail cell row addresses FRA[0:m] with bits of received row addresses RA[0:m], respectively. Outputs of the XNOR gates 701 are input to an AND gate 702. The AND gate 702 outputs a first comparison signal COMP1 based on the inputs from the XNOR gates 701.

The structure of the second comparator 608 may be similar to the first comparator 604, except in that the XNOR gates of the second comparator 608 compare bits of fail cell column addresses FCA[0:m] with bits of received column addresses CA[0:m].

Figure 8:
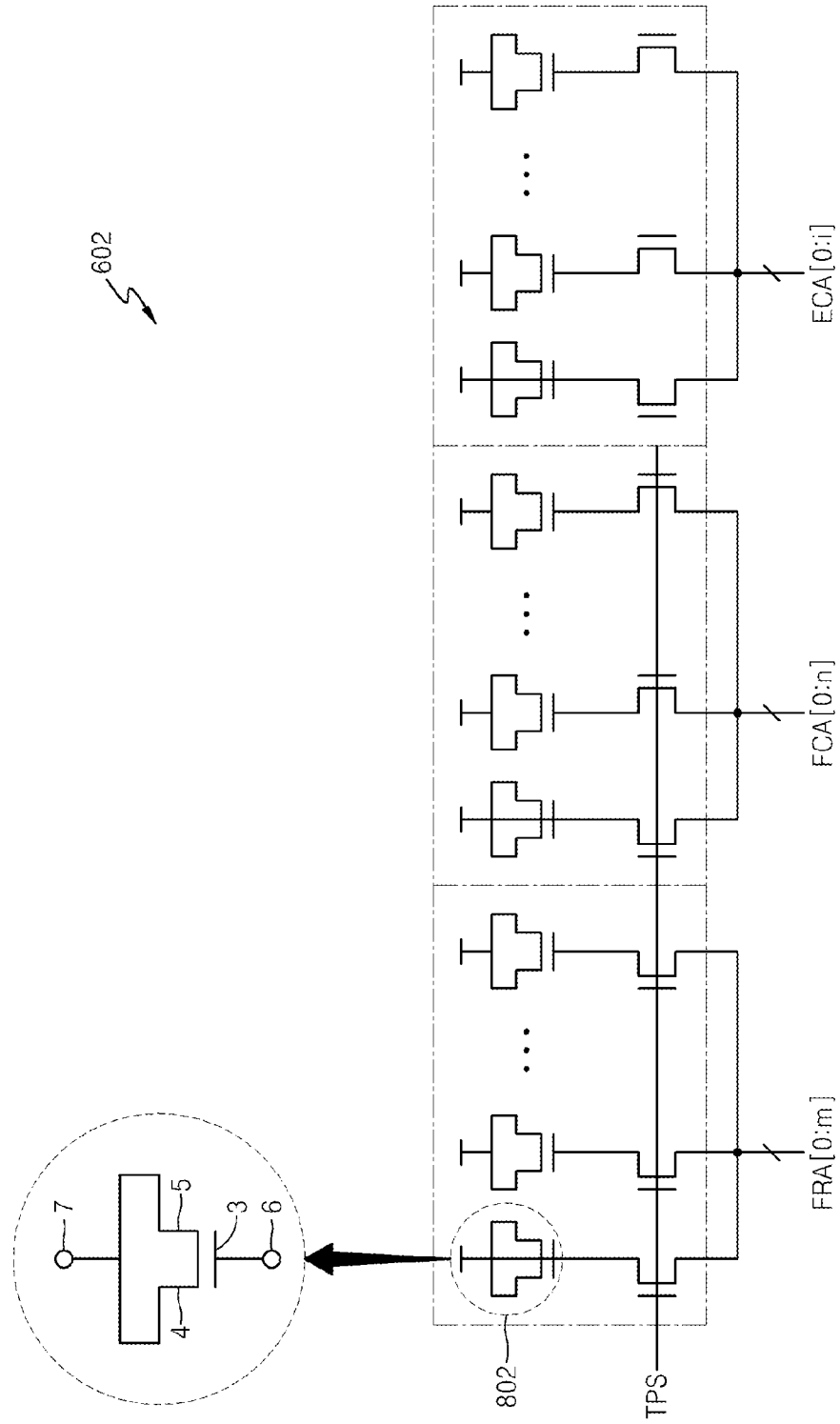
FIG. 8 is a diagram illustrating an example embodiment of the address storing table shown in FIG. 6A.

FIG. 8 is a diagram illustrating an example embodiment of the address storing table 602 of FIG. 6A.

Referring to FIG. 8, the address storing table 602 may be embodied as an anti-fuse array including a plurality of anti-fuses 802. The anti-fuses 802 have electrical characteristics that are opposite to those of fuse elements. The anti-fuses 802 are resistive fuse elements that have a relatively high resistance value when they are not programmed and a relatively low resistance value when they are programmed.

In general, each anti-fuse 802 has a structure in which a dielectric is inserted between conductors. Each of the anti-fuses 802 is programmed by applying a relatively high voltage via the conductors disposed at both ends thereof to destroy the dielectric between the conductors. By programming the anti-fuses 802, the conductors disposed at both ends in each of the anti-fuses 802 are short-circuited to cause the anti-fuses 802 to have a relatively low resistance value.

In this example, each of the anti-fuses 802 includes a depletion-type MOS transistor in which a source 4 and a drain 5 are connected. At an initial stage, a resistance value between a first node 6 connected to a gate electrode 3 and a second node 7 that is commonly connected to the source 4 and the drain 5 is relatively high (e.g., very high) since the first node 6 and the second node 7 are separated by a gate oxide film. Thus, current flow between the first node 6 and the second node 7 is suppressed and/or prevented. In one example, this state may be set to be logic 'low', which in this example refers to a non-programmed state.

The anti-fuses 802 may irreversibly transition from an 'on' state to an 'off' state by applying a break-down voltage between the first node 6 and the second node 7 to destroy the gate oxide film. When the gate oxide film is destroyed, the resistance value between the first node 6 and the second node 7 is lowered. This state may be set to be logic 'high', which in this example refers to a programmed state.

In the address storing table 602, fail cell row addresses FRA[0:m], fail cell column addresses FCA[0:n], and ECC column addresses ECA[0:i] may be stored by selectively programming the anti-fuses 802. Based on the pointer signal TPS, the address storing table 602 provides a fail cell row address FRA[0:m] to the first comparator 604 of FIG. 6A, provides the fail cell column address FCA[0:n] to the second comparator 608 of FIG. 6A, and provides the ECC column address ECA[0:i] to the buffer 612 of FIG. 6A.

Figure 9:
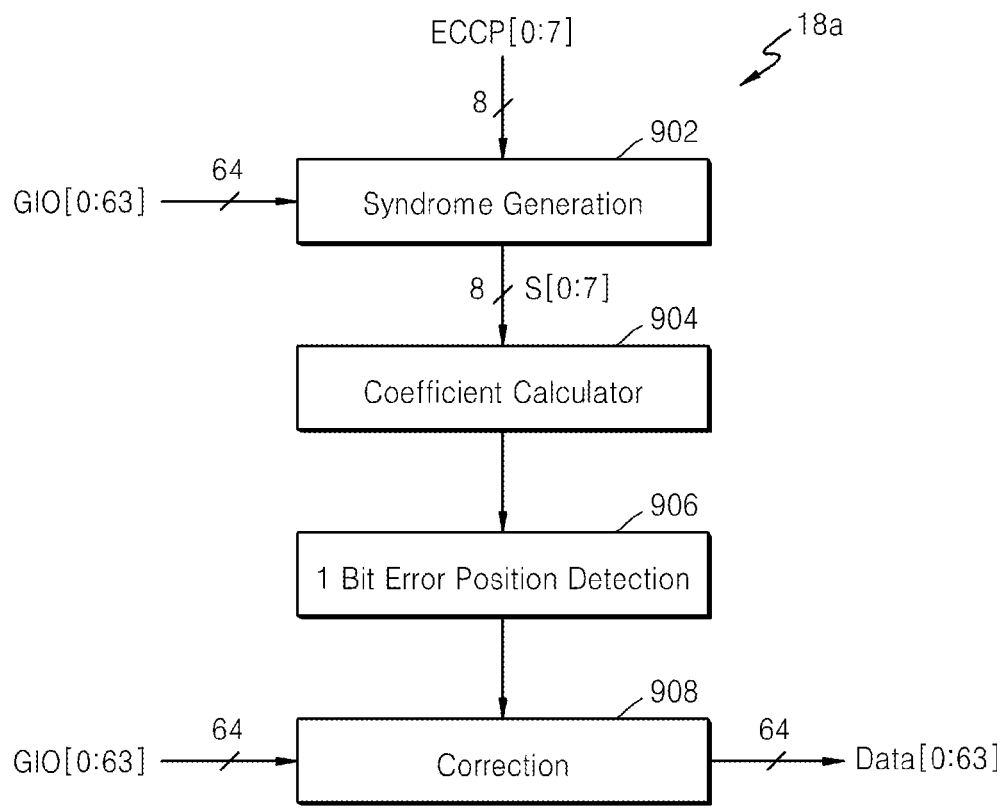
FIG. 9 is a diagram illustrating an ECC circuit according to an example embodiment.

FIG. 9 is a diagram illustrating an example embodiment of an ECC circuit 18a.

Referring to FIG. 9, the ECC circuit 18a performs an ECC decoding operation to correct error-bit data based on data read from memory cells including a fail cell in the DQ0 to DQ7 cell blocks 101 to 108 of FIG. 2A, 2B, or 3 via first to eighth data lines GIO[0:63] and parity bits delivered to parity data lines ECCP[0:7]. The ECC circuit 18a then outputs the error-corrected data Data[0:63].

The ECC circuit 18a includes a syndrome generation circuit 902, a coefficient calculator 904, a 1-bit error position detection circuit 906, and an error correction circuit 908.

The syndrome generation circuit 902 receives 64-bit read data via the first to eighth data lines GIO[0:63] and parity bits via the parity data lines ECCP[0:7]. The syndrome generation circuit 902 performs an XOR array operation to generate syndrome data S[0:7], and outputs the syndrome data S[0:7] to the coefficient calculator 904.

The coefficient calculator 904 calculates coefficients of an error location equation based on the syndrome data S[0:7].

The 1-bit error position detection circuit 906 calculates the location of a 1-bit error based on the syndrome data S[0:7]. In one example, the 1-bit error position detection circuit 906 may calculate the location of the 1-bit error and the coefficients of the error location equation simultaneously and/or concurrently. The error location equation is an equation in which the reciprocal of an error bit is used as a root.

The error correction circuit 908 determines the location of the 1-bit error based on the location of the 1-bit error calculated by the 1-bit error position detection circuit 906. The error correction circuit 908 corrects an error by inverting a logic value of an error bit in 64-bit data based on the determined location of the 1-bit error, and outputs error-corrected data Data[0:63].

Figure 10:
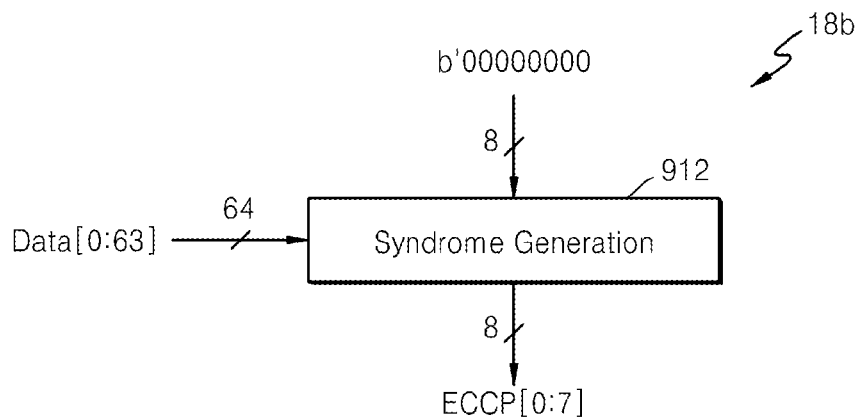
FIG. 10 is a diagram illustrating an ECC circuit according to another example embodiment.

FIG. 10 is a diagram illustrating an example embodiment of an ECC circuit 18b.

Referring to FIG. 10, the ECC circuit 18b performs an ECC encoding operation to generate parity bits associated with 64-bit write data Data[0:63] to be written to memory cells including a fail cell in the DQ0 to DQ7 cell blocks 101 to 108.

The ECC circuit 18b includes a syndrome generation circuit 912 that receives the 64-bit write data Data[0:63] and bits b'00000000. The syndrome generation circuit 912 generates parity bits by performing an XOR array operation on the received 64-bit write data Data[0:63] and bits b'00000000. The bits b'00000000 are used to generate parity bits associated with the 64-bit write data Data[0:63]. However, other particular bits may be used to generate parity bits regarding the 64-bit write data Data[0:63], instead of the bits b'00000000. The parity bits are transmitted to parity data lines ECCP[0:7].

Figure 11:
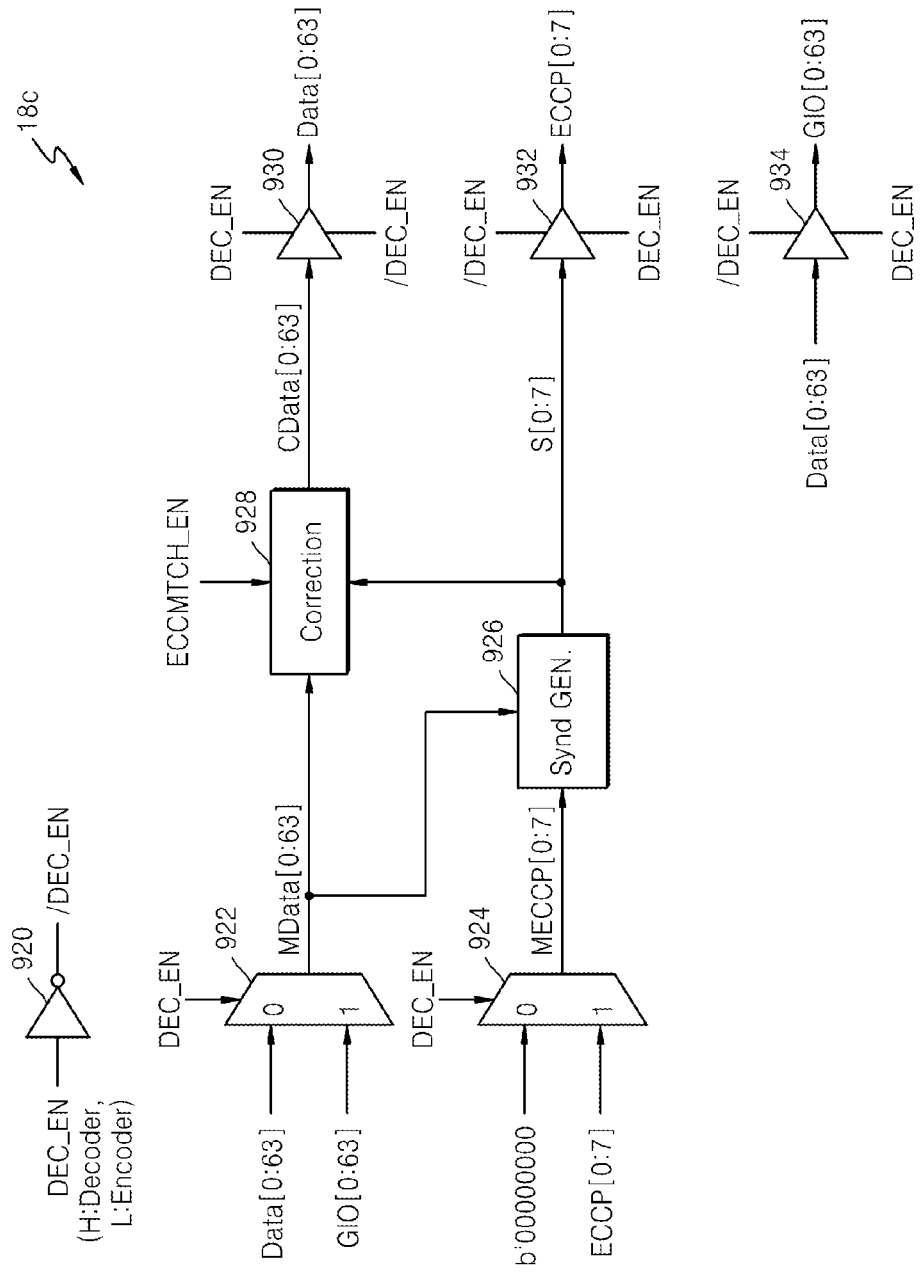
FIG. 11 is a diagram illustrating an ECC circuit according to still another example embodiment.

FIG. 11 is a diagram illustrating another example embodiment of an ECC circuit 18c.

Referring to FIG. 11, the ECC circuit 18c performs ECC encoding and decoding operations. The ECC circuit 18c includes first to fourth buffers 920, 930, 932, and 934, first and second multiplexers 922 and 924, a syndrome generation circuit 926, and an error correction circuit 928.

The first buffer 920 receives an ECC instruction signal DEC_EN, and generates an inverted ECC instruction signal/DEC_EN. In one example, the first buffer 920 may be embodied as an inverter.

In the example shown in FIG. 11, the first buffer 920 outputs an ECC instruction signal DEC_EN having a logic 'low' in response to a command CMD for a write operation from the control logic circuit 16 of FIG. 2A, 2B, or 3. The first buffer 920 outputs an ECC instruction signal DEC_EN having a logic 'high' in response to a command CMD for a read operation from the control logic circuit 16 of FIG. 2A, 2B, or 3.

In this example, the ECC instruction signal DEC_EN that is logic 'low' instructs the ECC circuit 18c to perform the ECC encoding operation, whereas the ECC instruction signal DEC_EN that is logic 'high' instructs the ECC circuit 18c to perform the ECC decoding operation.

The first multiplexer 922 selects write data Data[0:63] or 64-bit data received via first to eighth data lines GIO[0:63], and provides the selected data as an output MData[0:63] thereof, according to the ECC instruction signal DEC_EN. For example, when the ECC instruction signal DEC_EN is logic 'low', the write data Data[0:63] is output as the output MData[0:63] of the first multiplexer 922. When the ECC instruction signal DEC_EN is logic 'high', the 64-bit data received via the first to eighth data lines GIO[0:63] is output as the output MData[0:63] of the first multiplexer 922.

The second multiplexer 924 selects bits b'00000000 or parity bits received via parity data lines ECCP[0:7] and outputs the selected bits as an output MECCP[0:7] according to the ECC instruction signal DEC_EN. In one example, when the ECC instruction signal DEC_EN is logic 'low', the bits b'00000000 are output as the output MECCP[0:7] of the second multiplexer 924. When the ECC instruction signal DEC_EN is logic 'high', the parity bits received via the parity data lines ECCP[0:7] are output as the output MECCP[0:7] of the second multiplexer 924.

The syndrome generation circuit 926 receives the output MData[0:63] of the first multiplexer 922 and the output MECCP[0:7] of the second multiplexer 924, and generates syndrome data S[0:7].

In one example, when the ECC instruction signal DEC_EN is logic 'low', the write data Data[0:63] is provided as the output MData[0:63] of the first multiplexer 922 and the bits b'00000000 are provided as the output MECCP[0:7] of the second multiplexer 924. The syndrome generation circuit 926 receives the write data Data[0:63] and the bits b'00000000, and generates the syndrome data S[0:7] by performing an XOR array operation on the write data Data[0:63] and the bits b'00000000. The syndrome data S[0:7] is output to the parity data lines ECCP[0:7] via the third buffer 932. The syndrome data S[0:7] is used as parity bits associated with the write data Data[0:63]. The write data Data[0:63] is output to the first to eighth data lines GIO[0:63] via the fourth buffer 934, and is stored in the DQ0 to DQ7 cell blocks 101 to 108.

In this example, when the ECC instruction signal DEC_EN is logic 'high', 64-bit read data received via the first to eighth data lines GIO[0:63] is provided as the output MData[0:63] of first multiplexer 922, and parity bits received via the parity data lines ECCP[0:7] are provided as the output MECCP[0:7] of the second multiplexer 924. The syndrome generation circuit 926 receives the 64-bit read data and the parity bits, and generates syndrome data S[0:7] by performing an XOR array operation on the 64-bit read data and the parity bits. The syndrome data S[0:7] is output to the error correction circuit 928.

According to an ECC match signal ECCMTCH_EN, the error correction circuit 928 detects and corrects error bits in the output MData[0:63] of the first multiplexer 922 based on the syndrome data S[0:7], and outputs error-corrected data CData[0:63]. In this case, the output MData[0:63] of the first multiplexer 922 is 64-bit read data delivered via the first to eighth data lines GIO[0:63]. That is, the error correction circuit 928 detects and corrects error bits in 64-bit data read from memory cells including a fail cell, and outputs error-corrected data CData[0:63]. The error-corrected data CData [0:63] is output read data Data[0:63] via the second buffer 930.

Figure 12:
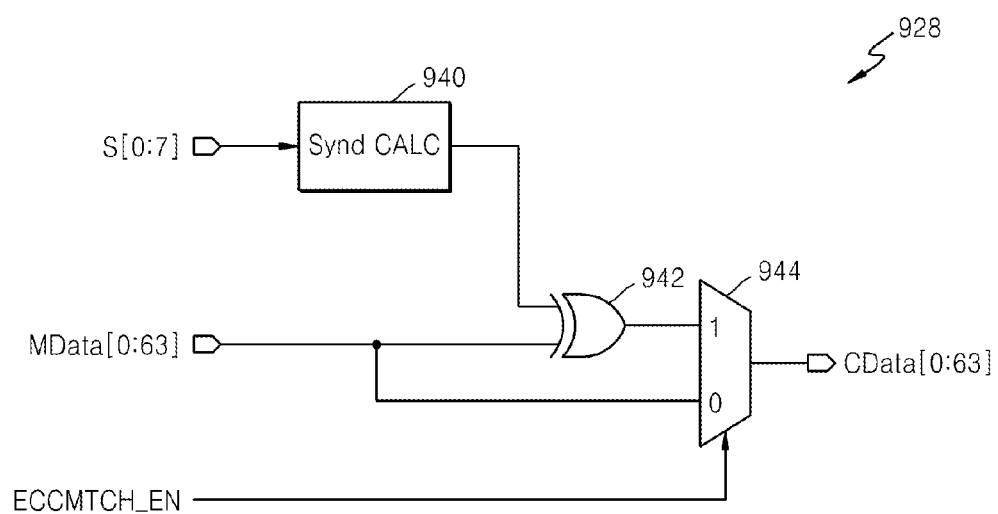
FIG. 12 is a diagram illustrating an example embodiment of the error correction circuit show in FIG. 11.

FIG. 12 is a diagram illustrating an example embodiment of the error correction circuit 928 of FIG. 11.

Referring to FIG. 12, the error correction circuit 928 includes a syndrome calculator 940, a bit inversion circuit 942, and a multiplexer 944. The syndrome calculator 940 calculates coefficients of an error location equation based on syndrome data S[0:7], and calculates the location of an error bit. Based on the location of the error bit calculated by the syndrome calculator 940, the bit inversion circuit 942 corrects an error bit in 64-bit read data MData[0:63] from the first multiplexer 922 delivered via first to eighth data lines GIO[0: 63] by inverting a logic value of the error bit.

Based on the ECC match signal ECCMTCH_EN, the multiplexer 944 selects and outputs either 64-bit read data MData [0:63] from the first multiplexer 922 or error-corrected data received from the bit inversion circuit 942.

In one example, when the ECC match signal ECC-MTCH_EN is logic 'high', the multiplexer 944 outputs error-corrected data from the bit inversion circuit 942 as the output data CData[0:63]. This matches the situation in which the error bit in the 64-bit read data is corrected since the ECC match signal ECCMTCH_EN is generated to be logic 'high' when the address of a fail cell matches row addresses RA0 to RAm and column addresses CA0 to CAn.

When the ECC match signal ECCMTCH_EN is logic 'low', the multiplexer 944 outputs the 64-bit read data transmitted via the first to eighth data lines GIO[0:63] as the output data CData[0:63]. This matches the situation in which the 64-bit read data does not contain error bits since the ECC match signal ECCMTCH_EN is generated to be logic 'low' when the address of the fail cell does not match the row addresses RA0 to RAm and the column addresses CA0 to CAn.

Figure 13:
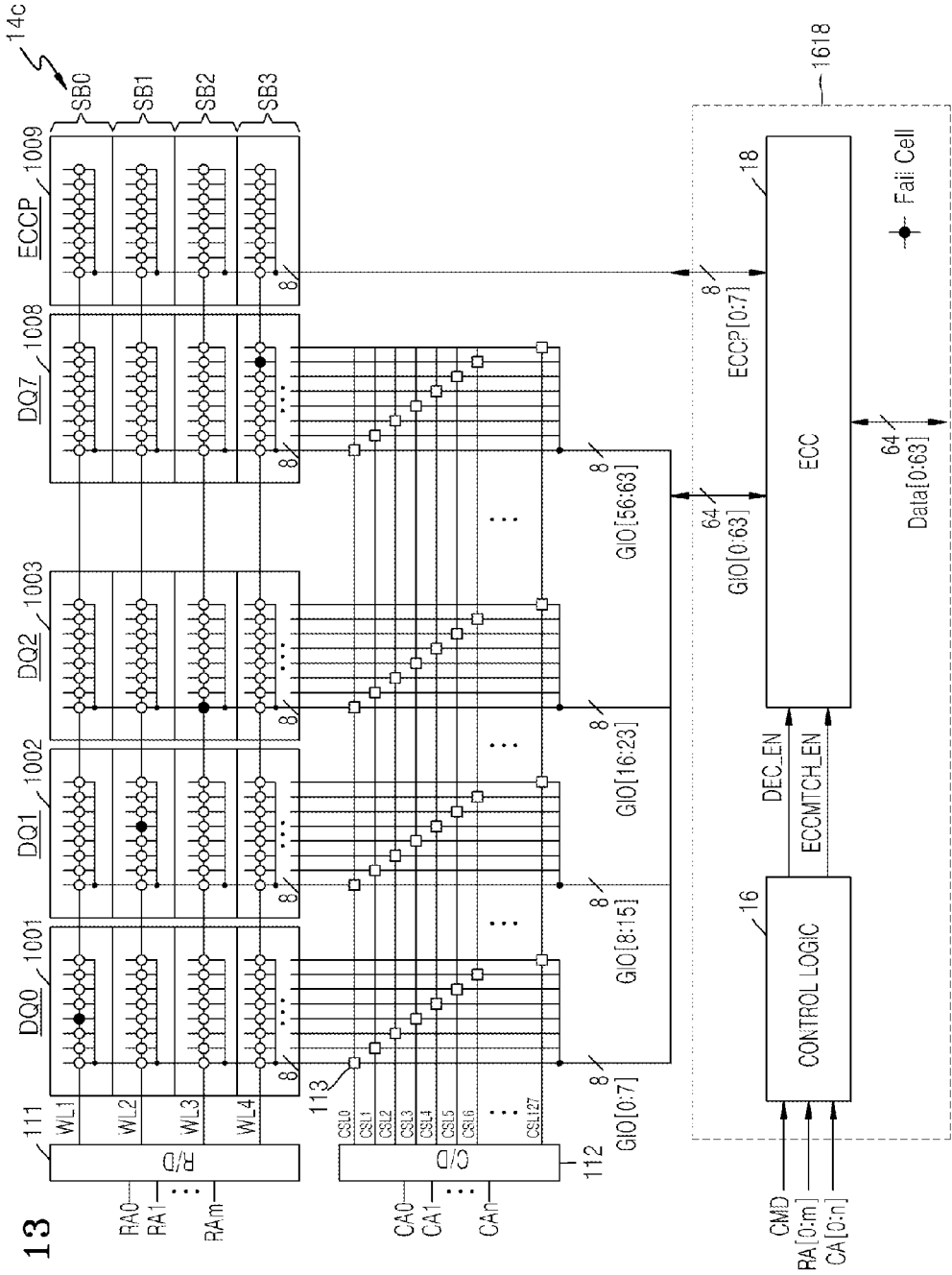
FIG. 13 is a block diagram of a memory device according to another example embodiment.

FIG. 13 is a block diagram of another example embodiment of a memory device 14c.

Referring to FIG. 13, the memory device 14c is similar to the memory device 14a of FIG. 2A, except that DQ0 to DQ7 cell blocks 1001 to 1008 and an ECC cell block 1009 each have a memory structure in which a plurality of memory cells are arranged in rows. For convenience of explanation, elements assigned the same reference numerals as those in FIG. 2A are not described again here.

Each of the DQ0 to DQ7 cell blocks 1001 to 1008 and the ECC cell block 1009 include four sub-blocks SB0 to SB3. In the DQ0 to DQ7 cell blocks 1001 to 1008 and the ECC cell block 1009, word lines of the sub-blocks SB0 to SB3 are addressed in the same or substantially the same manner. In the ECC cell block 1009, each of the sub-blocks SB0 to SB3 is used to repair a fail cell occurring in each of the sub-blocks SB0 to SB3 of the DQ0 to DQ7 cell blocks 1001 to 1008.

During a write operation in the memory device 14c, when fail cells in the sub-blocks SB0 to SB3 of the DQ0 to DQ7 cell blocks 1001 to 1008 are connected to first to fourth word lines WL1 to WL4, respectively, parity bits associated with each piece of data stored in memory cells selected by each of the first to fourth word lines WL1 to WL4 and a column selection circuit 113 are generated and stored in memory cells in the sub-blocks SB0 to SB3 of the ECC cell block 1009 connected to each of the first to fourth word lines WL1 to WL4.

During a read operation in the memory device 14c, error bits in fail cells in the sub-blocks SB0 to SB3 of the DQ0 to DQ7 cell blocks 1001 to 1008 are detected and corrected based on read data output to first to eighth data lines GIO[0: 63] from memory cells connected to one of the first to fourth word lines WL1 to WL4 and parity bit data transmitted to parity data lines ECCP[0:7] from memory cells of the ECC cell block 1009 connected to one of the first to fourth word lines WL1 to WL4.

In at least this example embodiment, a case in which each of the DQ0 to DQ7 cell blocks 1001 to 1008 and the ECC cell block 1009 included in the memory device 14c includes four sub-blocks SB0 to SB3 has been described above. However, the number of sub-blocks of each of the DQ0 to DQ7 cell blocks 1001 to 1008 and the ECC cell block 1009 is not limited to four. In this case, in the ECC cell block 1009 of the memory device 14c, one fail cell included in each of the sub-blocks may be repaired. Thus, the number of fail cells that may be repaired is equal or substantially equal to the number of sub-blocks.

Figure 14:
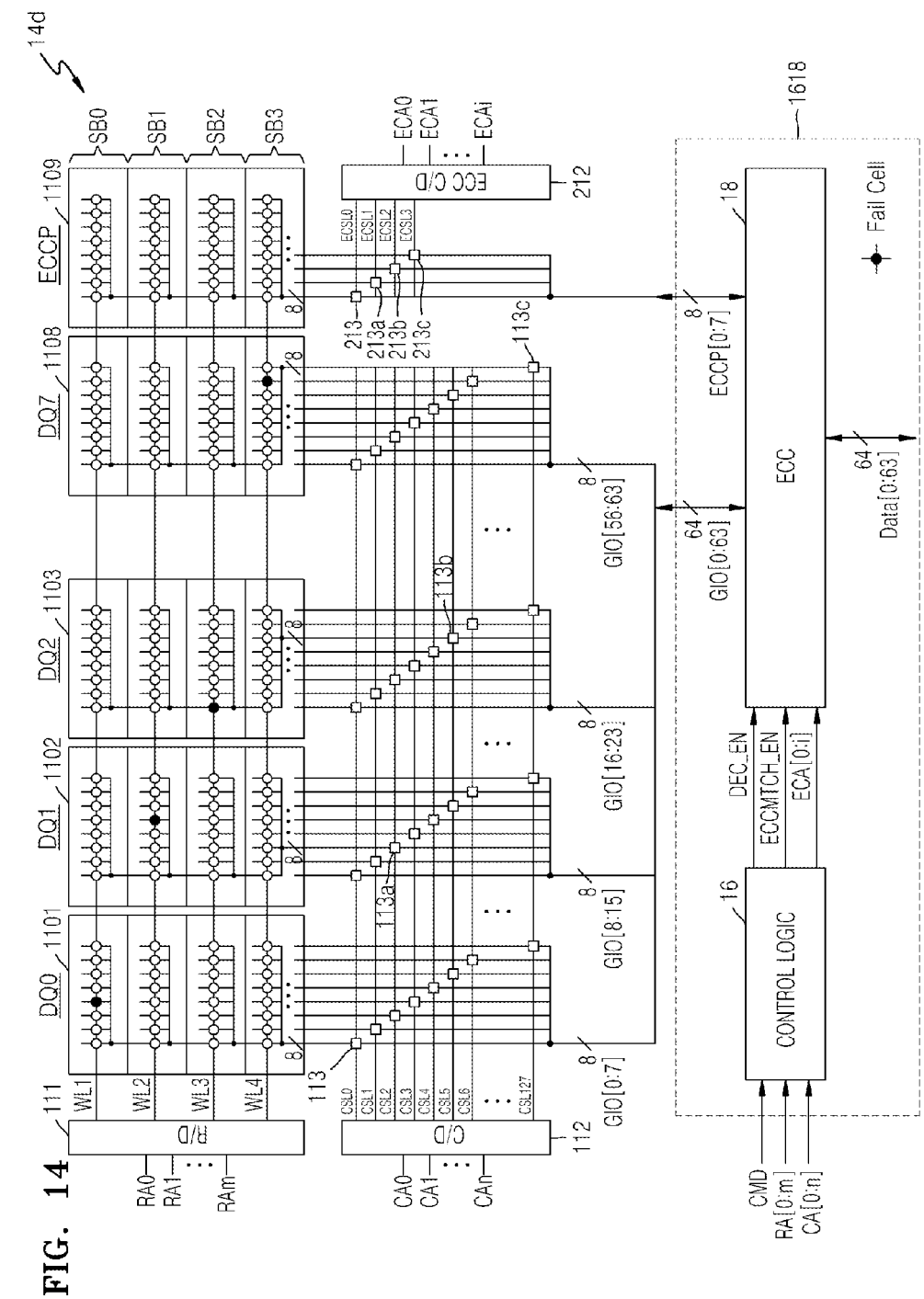
FIG. 14 is a block diagram of a memory device according to still another example embodiment.

FIG. 14 is a block diagram of another example embodiment of a memory device 14d.

Referring to FIG. 14, the memory device 14d is similar to the memory device 14b of FIG. 3, except that DQ0 to DQ7 cell blocks 1101 to 1108 and an ECC cell block 1109 each have a memory structure in which a plurality of memory cells are arranged in rows. For convenience of explanation, elements assigned the same reference numerals as those in FIG. 2A are not described again here.

In the example shown in FIG. 14, each of the DQ0 to DQ7 cell blocks 1101 to 1108 and the ECC cell block 1109 includes four sub-blocks SB0 to SB3. Each of the sub-blocks SB0 to SB3 of the ECC cell block 1109 is used to repair a plurality of fail cells in the respective sub-blocks SB0 to SB3 of the DQ0 to DQ7 cell blocks 1101 to 1108 that are accessed by different column selection circuits 113 to 113c.

During a write operation in the memory device 14d, when the fail cells in the respective sub-blocks SB0 to SB3 of the DQ0 to DQ7 cell blocks 1101 to 1108 that are accessed by different column selection circuits 113 to 113c are connected to first to fourth word lines WL1 to WL4, respectively, parity bits regarding data stored in each of the memory cells connected to the first to fourth word lines WL1 to WL4 are generated and stored in memory cells of the sub-blocks SB0 to SB3 of the ECC cell block 1109 connected to the first to fourth word lines WL1 to WL4.

During a read operation in the memory device 14d, error bits in fail cells in the sub-blocks SB0 to SB3 of the DQ0 to DQ7 cell blocks 1101 to 1108, which are connected to the first to fourth word lines WL1 to WL4, respectively, are detected and corrected based on read data output to the first to eighth data lines GIO[0:63] from the memory cells connected to the first to fourth word lines WL1 to WL4 and parity bits output to parity data lines ECCP[0:7] from memory cells of the ECC cell block 1009 connected to the first to fourth word lines WL1 to WL4, respectively.

In at least this example embodiment, a case in which each of the DQ0 to DQ7 cell blocks 1101 to 1108 and the ECC cell block 1109 included in the memory device 14d includes four sub-blocks SB0 to SB3 has been described above. However, the number of sub-blocks of each of the DQ0 to DQ7 cell blocks 1101 to 1108 and the ECC cell block 1109 is not limited to four.

Figure 15:
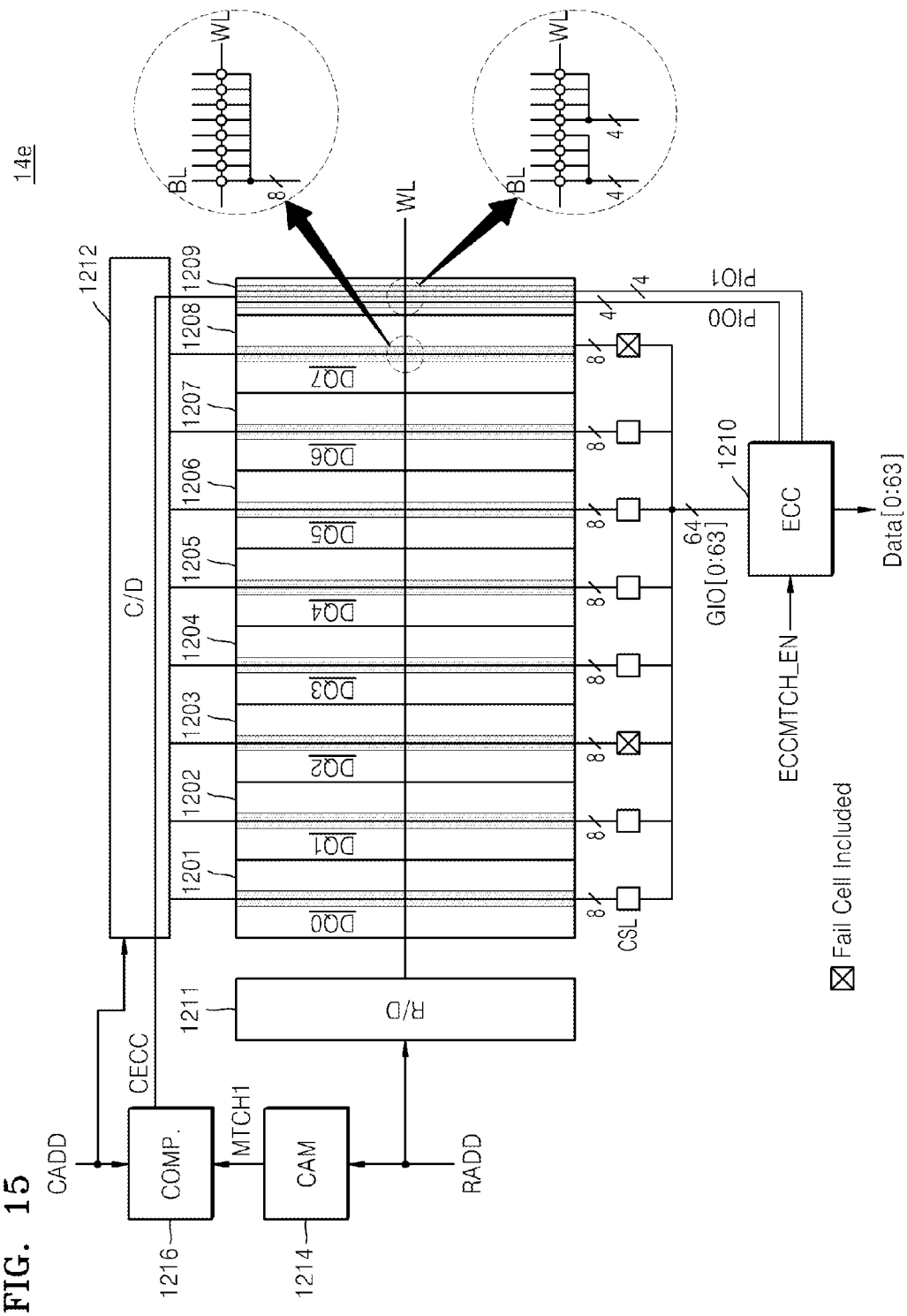
FIG. 15 is a block diagram of a memory device according to yet another example embodiment.

FIG. 15 is a block diagram of yet another example embodiment of a memory device 14e.

Referring to FIG. 15, the memory device 14e includes DQ0 to DQ7 cell blocks 1201 to 1208, an ECC cell block 1209, and an ECC circuit 1210. In the memory device 14e, a column ECC method is employed to perform ECC on only bit lines (columns) of a DQ cell block including a fail cell among the DQ0 to DQ7 cell blocks 1201 to 1208.

The DQ0 to DQ7 cell blocks 1201 to 1208 include a plurality of word lines WL and a plurality of bit lines BL that are arranged in rows and columns. The ECC cell block 1209 includes a plurality of word lines WL, and in this example, eight bit lines BL. In the ECC cell block 1209, four bit lines BL are connected to a parity data line PIO0 and the other four bit lines BL are connected to a parity data line PIO1. In each of the DQ0 to DQ7 cell blocks 1201 to 1208 and the ECC cell block 1209, the word lines WL are enabled by a row decoder 1211 that decodes an received row address RADD.

The bit lines BL of the DQ0 to DQ7 cell blocks 1201 to 1208 are selected by a column decoder 1212 that decodes a received column address CADD and a column selection circuit. The bit lines BL of the DQ0 to DQ7 cell blocks 1201 to 1208 may be connected to a plurality of column selection lines as illustrated in FIG. 2A. In at least this example embodiment, a case in which a column selection circuit CSL is selected based on the received column address CADD and eight bit lines are selected among the DQ0 to DQ7 cell blocks 1201 to 1208 by the column selection circuit CSL will be described.

In this example, it is assumed that in the DQ0 to DQ7 cell blocks 1201 to 1208, a fail cell is present in each of the DQ2 cell block 1203 and the DQ7 cell block 1208 among memory cells selected based on the received row address RADD and the received column address CADD. Thus, in the DQ0 to DQ7 cell blocks 1201 to 1208, two error bits are included in 64-bit data delivered via the column selection circuit CSL. Although in this example embodiment, two error bits are present in the DQ2 and DQ7 cell blocks 1203 and 1208, example embodiments are not limited thereto and one error bit or a 1-error bit may be present in each of the DQ2 and DQ7 cell blocks 1203 and 1208.

During a test of the memory device 14e, fail cell row addresses and fail cell column addresses for addressing respective fail cells in the respective DQ2 and DQ7 cell blocks 1203 and the 1208 are stored. In the memory device 14e, four bit lines in the ECC cell block 1209 may be used to repair the fail cell in each of the DQ2 and DQ7 cell blocks 1203 and 1208. In other words, for example, four parity bits stored in the ECC cell block 1209 are used to repair a 1-bit error included in 8-bit data output from the DQ2 cell block 1203. Also, four parity bits stored in the ECC cell block 1209 are used to repair a 1-bit error included in 8-bit data output from the DQ7 cell block 1208. Table 1 shows that a 4-bit parity is needed to perform ECC on 8-bit data.

In the memory device 14e, the ECC circuit 1210 is used to repair fail cells. The ECC circuit 1210 detects the location of a 1-bit error and corrects the 1-bit error by inverting a logic value at the location of the 1-bit error by using a comparator 1216 and a CAM cell array 1214 that provides address information regarding a target fail cell.

The CAM cell array 1214 stores a fail cell row address and a fail cell column address of a fail cell detected during a test of the memory device 14e. When a received row address RADD input to the memory device 14e is the same as (matches) the fail cell row address, the CAM cell array 1214 generates a first match signal MTCH1 and outputs the fail cell column address to the comparator 1216. When a received column address CADD input to the memory device 14e is the same as (matches) the fail cell column address, the comparator 1216 generates a column ECC control signal CECC. The column decoder 1212 selects four bit lines in the ECC cell block 1209 based on the column ECC control signal CECC.

For example, when the received row address RADD and the received column address CADD input to the memory device 14e are the same as a fail cell row address and a fail cell column address in the DQ2 cell block 1203, four parity bits stored in four memory cells selected by the address of a corresponding row in the ECC cell block 1209 and the column ECC control signal CECC are read via a parity data line PIO0. In this case, the four parity bits are parity bits regarding 8-bit data stored in a fail cell in the DQ2 cell block 1203.

Also, in the memory device 14e, four parity bits stored in four memory cells selected by the address of a corresponding row in the ECC cell block 1209 and the column ECC control signal CECC are read via the parity data line PIO1. In this case, the four parity bits are parity bits associated with 8-bit data stored in a fail cell in the DQ2 cell block 1208.

Then, in the DQ0 to DQ7 cell blocks 1201 to 1208 in the memory device 14e, 64-bit data stored in memory cells selected based on the received row address RADD and the received column address CADD are read and provided to the ECC circuit 1210. Also, in the ECC cell block 1209, four parity bits P0 to P3 associated with fail cells in the DQ2 cell block 1203 and four parity bits P0 to P3 associated with fail cells in the DQ7 cell block 1208 selected based on the received row address RADD and the column ECC control signal CECC are read and provided to the ECC circuit 1210. The ECC circuit 1210 detects a 1-bit error in each of the DQ2 cell block 1203 and the DQ7 cell block 1208 from 64-bit data read from the DQ0 to DQ7 cell blocks 1201 to 1208, and corrects the 1-bit error.

Figure 16:
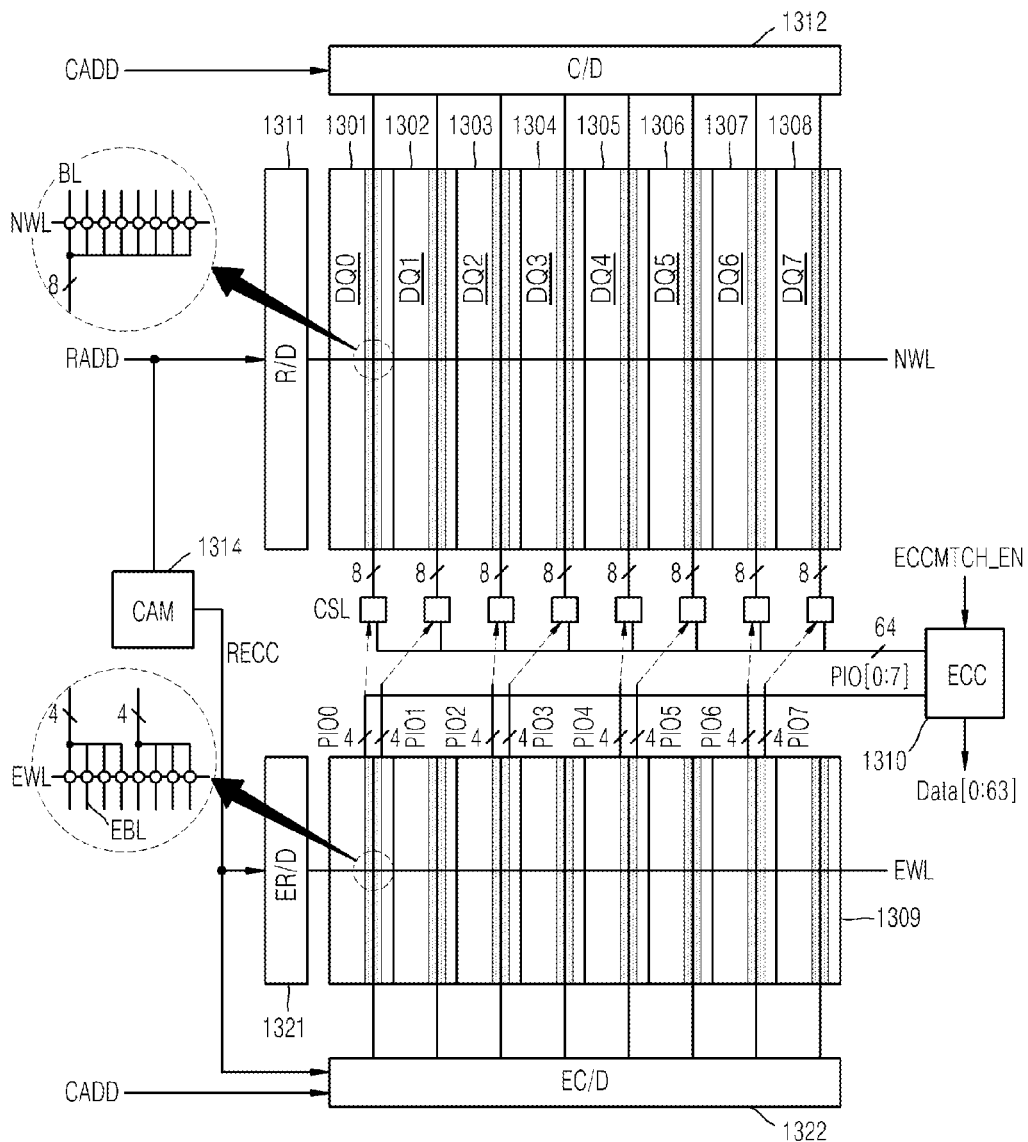
FIG. 16 is a block diagram of a memory device according to another example embodiment.

FIG. 16 is a block diagram of another example embodiment of a memory device 14f.

Referring to FIG. 16, the memory device 14f includes DQ0 to DQ7 cell blocks 1301 to 1308 and an ECC cell block 1309. In the memory device 14f, a row ECC method is employed to perform ECC only on word lines NWL connected to fail cells occurring in a DQ cell block among the DQ0 to DQ7 cell blocks 1301 to 1308.

The DQ0 to DQ7 cell blocks 1301 to 1308 include a plurality of word lines NWL and a plurality of bit lines BL arranged in rows and columns. The word lines NWL are enabled by a first row decoder 1311 that decodes a received row address RADD. The bit lines BL of the DQ0 to DQ7 cell blocks 1301 to 1308 are selected by a column selection circuit CSL and a first column decoder 1312 that decodes a received column address CADD.

The bit lines BL of the DQ0 to DQ7 cell blocks 1301 to 1308 are connected to a plurality of column selection circuits as illustrated in FIG. 2A. An example case in which the column selection circuit CSL is selected based on the received column address CADD, and in which the column selection circuit CSL selects eight bit lines of each of the DQ0 to DQ7 cell blocks 1301 to 1308 will be described.

The ECC cell block 1309 is used to repair word lines WL of fail cells occurring in each of the DQ0 to DQ7 cell blocks 1301 to 1308. The ECC cell block 1309 includes a plurality of word lines EWL and a plurality of bit lines EBL arranged in rows and columns. The word lines EWL are enabled by a second row decoder 1321, and the bit lines EBL are selected by a second column decoder 1322.

In the ECC cell block 1309, the number of word lines EWL may be less than the number of word lines NWL of the DQ0 to DQ7 cell blocks 1301 to 1308, and the number of bit lines EBL may be equal to the number of bit lines BL of the DQ0 to DQ7 cell blocks 1301 to 1308. In this example, the bit lines EBL correspond to the bit lines BL of the DQ0 to DQ7 cell blocks 1301 to 1308, respectively. Among the bit lines EBL of the ECC cell block 1309, for example, four bit lines EBL are connected to parity data lines PIO[0:7], respectively.

In the memory device 14f, an ECC circuit 1310 is used to repair fail cells. The ECC circuit 1310 detects the location of an error bit by using a CAM cell array 1314 that provides address information regarding a target fail cell, and corrects the error bit by inverting a logic value of the error bit.

The CAM cell array 1314 stores fail cell row addresses detected from the respective DQ0 to DQ7 cell blocks 1301 to 1308 during a test of the memory device 14f. When received row addresses RADD input to the memory device 14f are the same as the fail cell row addresses in the respective DQ0 to DQ7 cell blocks 1301 to 1308, the CAM cell array 1414 generates a row ECC control signal RECC that drives the second row decoder 1321 and the second column decoder 1322.

The second row decoder 1321 performs decoding using column addresses CA[9:7] that are not used as a received column address CADD among column addresses used in the memory device 14f, and enables a corresponding word line EWL according to the row ECC control signal RECC and the column addresses CA[9:7]. The second column decoder 1322 decodes the received column address CADD, and selects four bit lines EBL among the bit lines EBL of the ECC cell block 1309 according to the row ECC control signal RECC and the received column address CADD.

The bit lines EBL of the ECC cell block 1309 correspond to the bit lines BL of the DQ0 to DQ7 cell blocks 1301 to 1308, respectively. However, to perform ECC only on word lines of a DQ cell block in which fail cells occur, four bit lines EBL selected according to the row ECC control signal RECC and the received column address CADD may not correspond to the bit lines BL of each of the DQ0 to DQ7 cell blocks 1301 to 1308.

In this example, four bit lines EBL among bit lines EBL of the ECC cell block 1309 corresponding to bit lines BL of the DQ0 cell block 1301 correspond to bit lines of memory cells connected to word lines of fail cells in the DQ0 cell block 1301 and the DQ1 cell block 1302, and are connected to parity data lines PIO0 and PIO1. Four bit lines EBL among bit lines EBL of the ECC cell block 1309 corresponding to the bit lines of the DQ2 cell block 1303 correspond to bit lines of memory cells connected to word lines of fail cells in the DQ2 cell block 1303 and the DQ3 cell block 1304, and are connected to parity data lines PIO2 and PIO3.

Four bit lines EBL among bit lines EBL of the ECC cell block 1309 corresponding to the bit lines of the DQ4 cell block 1305 correspond to bit lines of memory cells connected to word lines of fail cells in the DQ4 cell block 1305 and the DQ5 cell block 1306, and are connected to parity data lines PIO4 and PIO5.

Four bit lines EBL among bit lines EBL of the ECC cell block 1309 corresponding to the bit lines of the DQ6 cell block 1307 correspond to bit lines of memory cells connected to word lines of fail cells in the DQ6 cell block 1307 and the DQ7 cell block 1308, and are connected to parity data lines PIO6 and PIO7.

In the ECC cell block 1309, four parity bits stored in four memory cells connected to a selected word line EWL and four bit lines EBL are read via parity data lines PIO[0:7]. In this case, the four parity bits are parity bits associated with 8-bit data stored in memory cells selected by a column selection circuit CSL and a word line NWL of a DQ cell block including fail cells.

In the DQ0 to DQ7 cell blocks 1301 to 1308 of the memory device 14f, 64-bit data stored in memory cells selected based on a received row address RADD and received column address CADD is read and provided to the ECC circuit 1310. Also, in the ECC cell block 1309, four parity bits stored in four memory cells connected to a selected word line EWL and four bit lines EBL are provided to the ECC circuit 1310. The ECC circuit 1310 detects a 1-bit error in the 64-bit data from memory cells connected to a word line of a fail cell, and corrects the 1-bit error.

Figure 17:
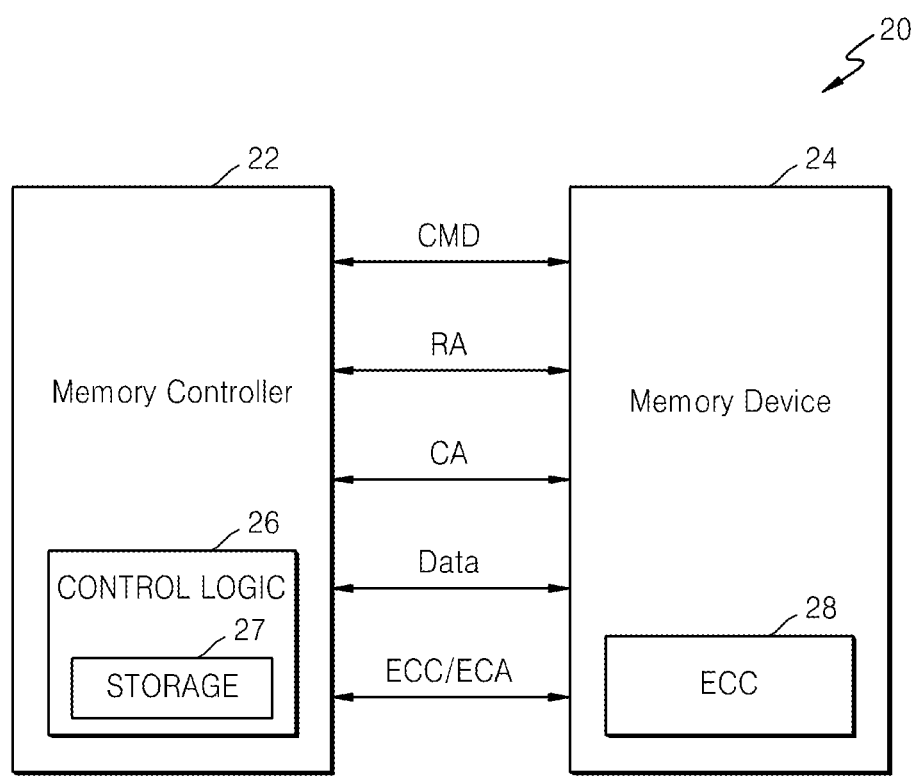
FIG. 17 is block diagram of an example embodiment of a memory system including a memory device configured to perform selective ECC.

FIG. 17 is block diagram of an example embodiment of a memory system 20 including a memory device 24 for performing selective ECC.

Referring to FIG. 17, the memory system 20 is similar to the memory system 10 in FIG. 1, except that a fail address storing circuit 27 that stores fail cell addresses for addressing fail memory cells in the memory device 24 is included in the memory controller 22. The memory controller 22 controls the memory device 24. The memory controller 22 transmits control signals (e.g., a command CMD, a row address RA, a column address CA, an ECC driving signal ECC, data Data, etc.), to the memory device 24, and receives data Data from the memory device 24.

The fail address storing circuit 27 stores fail addresses generated during a test of the memory device 24 or may update and store fail addresses that are newly generated during operation of the memory device 24 mounted in the memory system 20. The memory controller 22 is capable of determining whether an access row address RA[0:m] and an access column address CA[0:n] for accessing the memory device 24 are stored in the fail address storing circuit 27.

When the memory controller 22 outputs the access row address RA[0:m] and the access column address CA[0:n] corresponding to fail memory cells in the memory device 24, the memory controller 22 outputs an ECC driving signal ECC together with the access row address RA[0:m] and the access column address CA[0:n] to the memory device 24. The memory device 24 drives an ECC circuit 28 to perform selective ECC according to the ECC driving signal ECC. According to at least some example embodiments, the memory controller 22 may drive the ECC circuit 28 to perform selective ECC in the memory device 24 by using a given, desired or predetermined address signal ECA, instead of the ECC driving signal ECC.

The ECC driving signal ECC drives the ECC circuit 28 in a manner similar or substantially similar to the ECC instruction signal DEC_EN and the ECC match signal ECC-MTCH_EN discussed above. The ECC circuit 28 performs selective ECC on a bit line of a fail memory cell or a word line of a fail cell based on the ECC driving signal ECC.

Based on the ECC driving signal ECC, the ECC circuit 28 detects the location of an error bit in data read from memory cells including a fail memory cell by using parity bits associated with the fail memory cell, corrects data corresponding to the error bit, and outputs error-corrected data.

Memory devices capable of performing selective ECC, such as those according to one or more example embodiments, may be included in a semiconductor memory device, such as a double data rate-synchronous dynamic random access memory (DDR-SDRAM).

Figure 18:
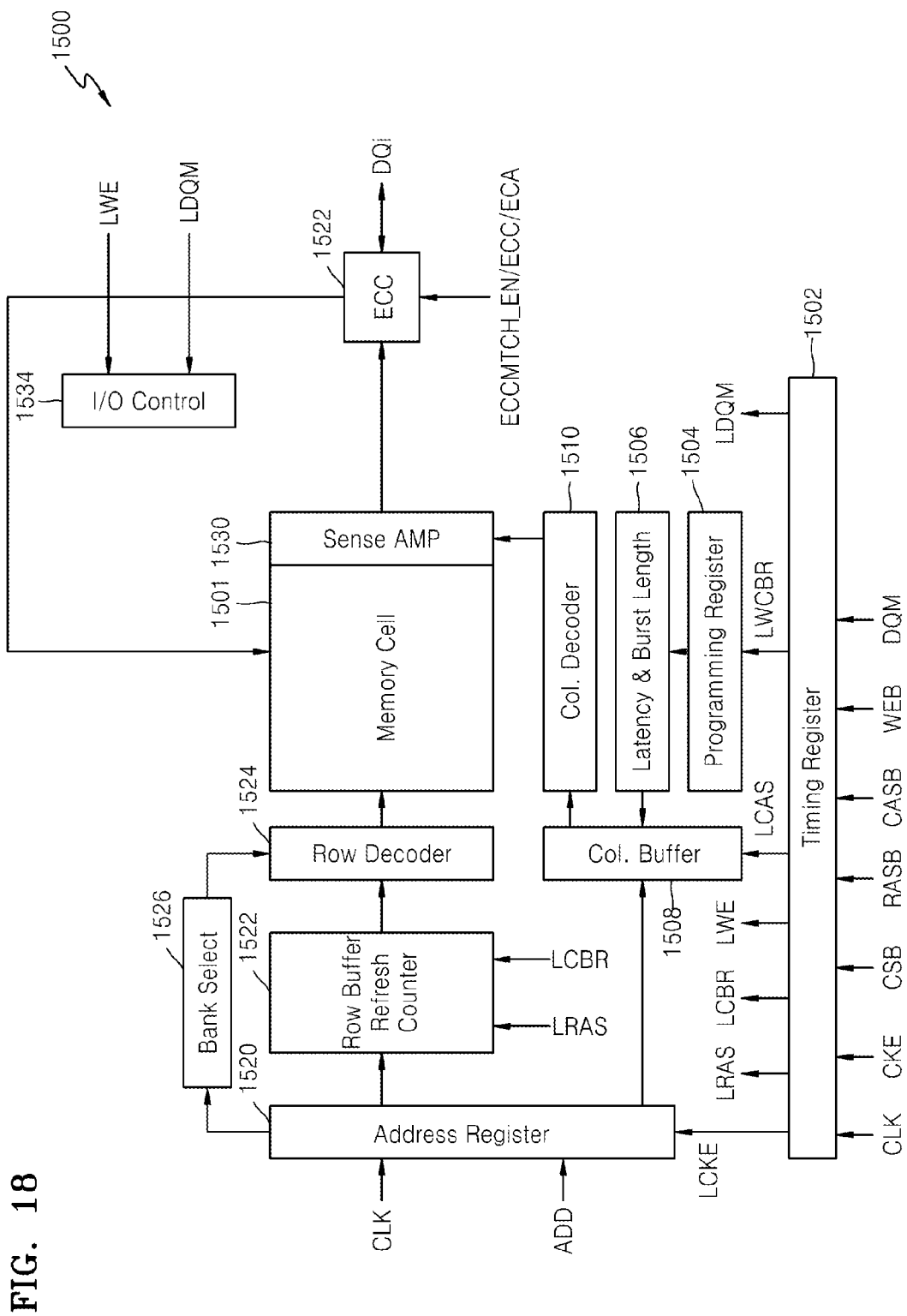
FIG. 18 a block diagram of another example embodiment of a memory device.

FIG. 18 illustrates an example embodiment of a DDR-SDRAM 1500.

Referring to FIG. 18, the DDR-SDRAM 1500 includes a memory cell array 1501 including DRAM cells, and various circuit blocks for driving the DRAM cells. For example, a timing register 1502 is activated when a chip selection signal CS changes from a deactivation level (e.g., logic 'high') to an activation level (e.g., logic 'low'). The timing register 1502 receives command signals CMD (e.g., a clock signal CLK, a clock enable signal CKE, a chip selection signal CSB, a row address strobe signal RASB, a column address strobe signal CASB, a write enable signal WEB, a data input/output mask signal DQM, etc.) from the outside (e.g., an external source), and processes the received command signals CMD to generate various internal command signals LRAS, LCBR, LWE, LCAS, LWCBR, LDQM, etc. for controlling the various circuit blocks.

At least some of these internal command signals generated by the timing register 1502 are stored in a programming register 1504. For example, latency information or burst length information related to data output may be stored in the programming register 1504. The internal command signals stored in the programming register 1504 may be provided to a latency/burst length control circuit 1506. The latency/burst length control circuit 1506 provides a control signal for controlling the latency or burst length for data output to a column decoder 1510 or an output buffer 1512 via a column buffer 1508.

An address register 1520 receives an address signal ADD from the outside (e.g., an external source). A row address signal is provided to a row decoder 1524 via a row address buffer/refresh counter 1522. A column address signal is provided to a column decoder 1510 via a column address buffer 1508.

The row address buffer/refresh counter 1522 further receives a refresh address signal generated by a refresh counter according to refresh commands LRAS and LCBR, and provides the row address signal or the refresh address signal to the row decoder 1524. Also, the address register 1520 provides a bank signal for selecting a bank to a bank selection circuit 1526.

The row decoder 1524 decodes the row address signal or the refresh address signal received from the row address buffer/refresh counter 1522, and activates a word line of the memory cell array 1501. The column decoder 1510 decodes the column address signal, and selects a bit line of the memory cell array 1501. In one example, a column selection line may be employed in the semiconductor memory device 1500 so that a selection operation may be performed via the column selection line.

A sense amplifier 1530 provides data read from a memory cell selected by the row decoder 1524 and the column decoder 1510 to an ECC circuit 1522. Data that is to be written to a data cell is provided to the memory cell array 1501 via the ECC circuit 1532. Although not shown, the memory cell array 1501 may include DQ0 to DQ7 cell blocks and an ECC cell block according to example embodiments discussed herein. The ECC cell block stores parity bits regarding fail cells in the DQ0 to DQ7 cell blocks. The ECC circuit 1532 selectively performs ECC on a bit line of or a word line of a fail cell according to a command or a control signal supplied to the DDR-SDRAM 1500.

In at least one example embodiment, the ECC circuit 1532 detects the location of an error bit based on parity bits associated with a corresponding fail cell, corrects data corresponding to the error bit, and outputs the error-corrected data via a data I/O pad DQi.

Figure 19:
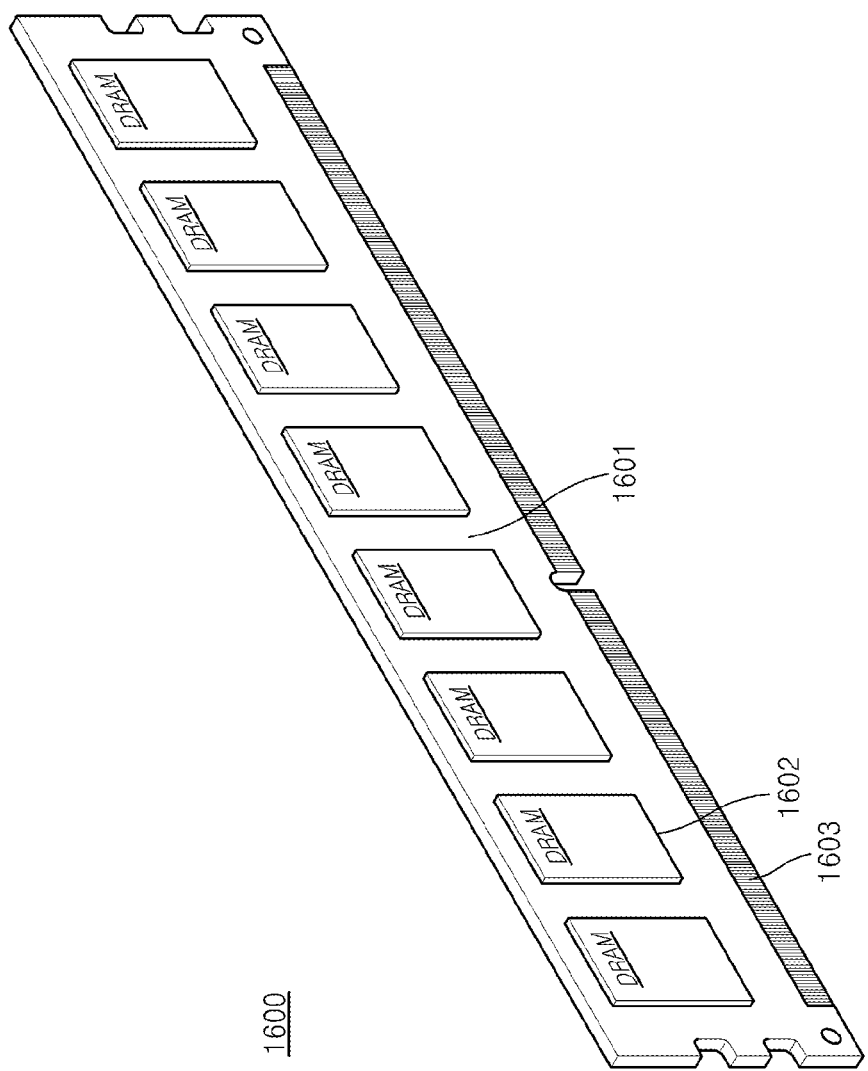
FIGS. 19 to 21 illustrate example embodiments of memory modules including dynamic random access memory (DRAM) configured to perform selective ECC.
Figure 20:
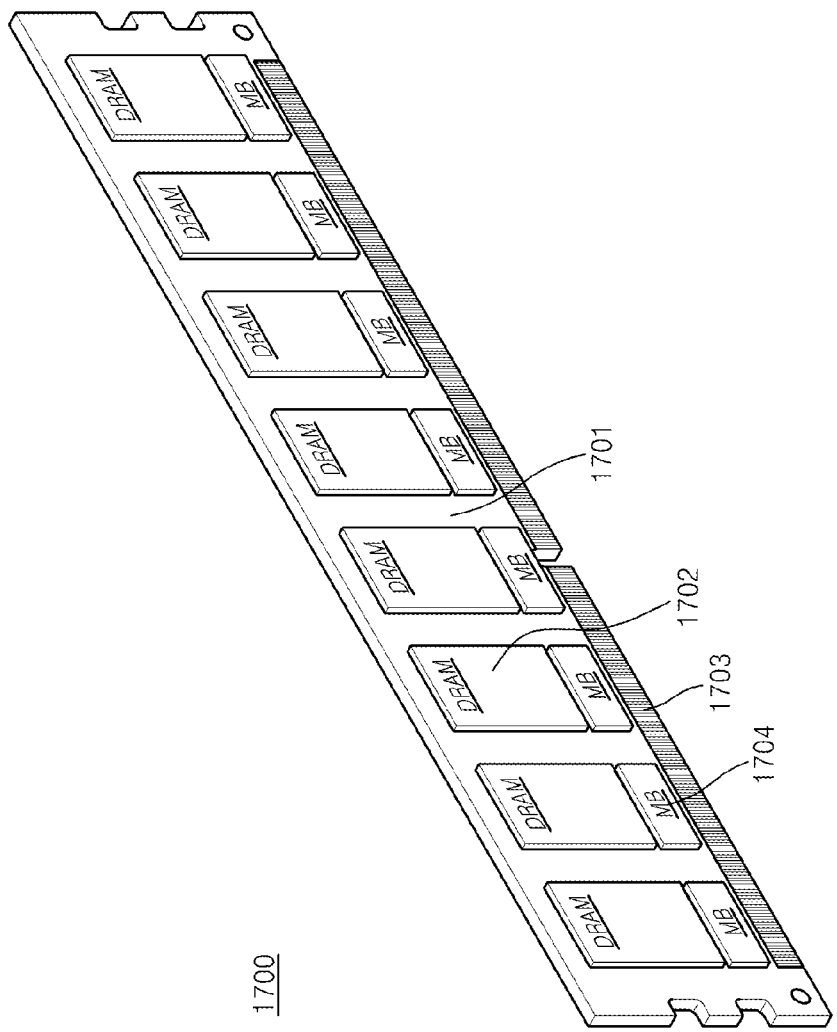
Figure 21:
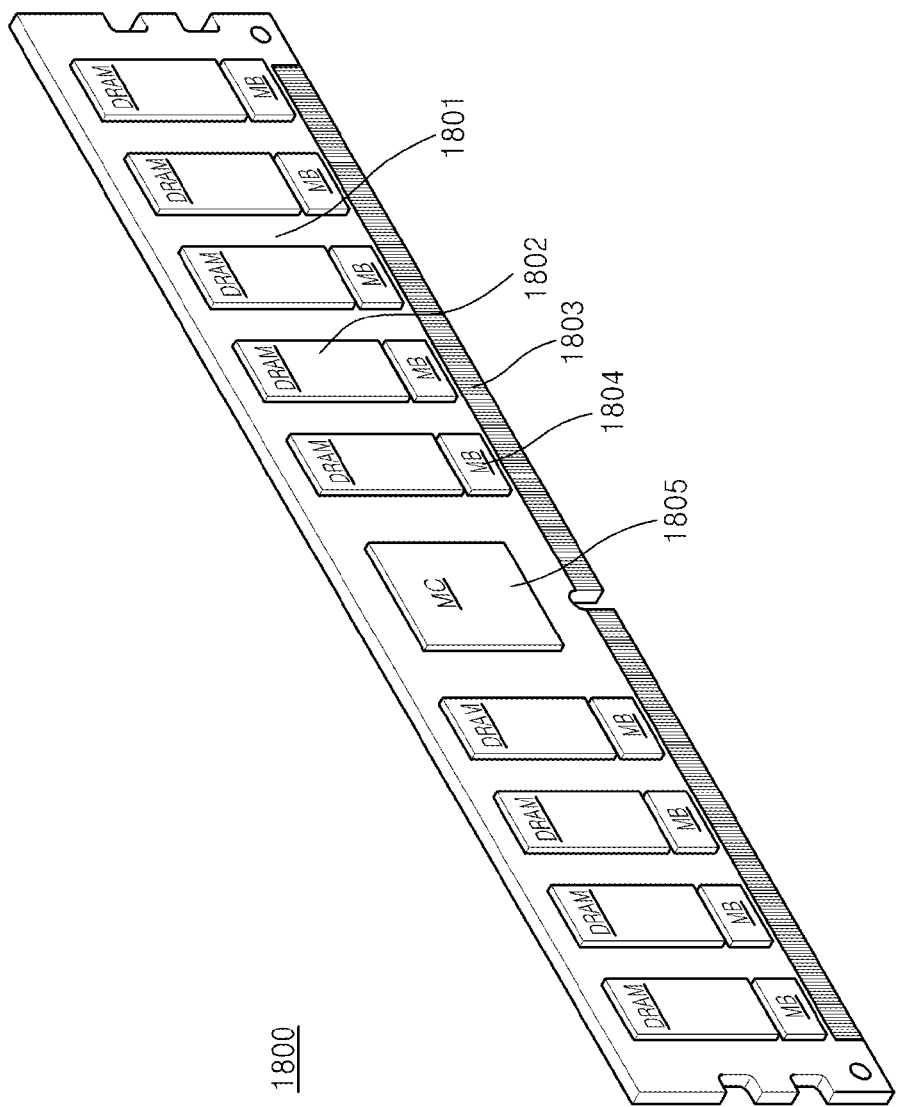

FIGS. 19 to 21 illustrate example embodiments of memory modules including DRAM for performing selective ECC.

Referring to FIG. 19, a memory module 1600 includes a printed circuit board 1601, a plurality of DRAM chips 1602, and a connector 1603. The plurality of DRAM chips 1602 may be combined with an upper surface and a lower surface of the printed circuit board 1601. The connector 1603 is electrically connected to the plurality of DRAM chips 1602 via conductive lines (not shown). Also, the connector 1603 may be connected to a slot of an external host (not shown).

Although not shown, in this example each of the plurality of DRAM chips 1602 includes a memory cell array including DQ0 to DQ7 cell blocks, an ECC cell block, and an ECC circuit according to example embodiments discussed herein. The ECC cell block stores parity bits associated with fail cells in the DQ0 to DQ7 cell blocks. The ECC circuit selectively performs ECC on a bit line and/or a word line of a fail cell according to a command or a control signal input to each of the plurality of DRAM chips. The ECC circuit detects the location of an error bit and corrects data of the error bit based on the parity bits associated with a corresponding fail cell.

Referring to FIG. 20, a memory module 1700 includes a printed circuit board 1701, a plurality of DRAM chips 1702, a connector 1703, and a plurality of buffer chips 1704. Each of the plurality of buffer chips 1704 is disposed between one of the plurality of DRAM chips 1702 and the connector 1703. The plurality of DRAM chips 1702 and the plurality of buffer chips 1704 are mounted on an upper surface and a lower surface of the printed circuit board 1701. The plurality of DRAM chips 1702 and the plurality of buffer chips 1704 mounted on the upper surface and the lower surface of the printed circuit board 1701 are connected via a plurality of via holes.

Although not shown, in this example each of the plurality of DRAM chips 1702 includes a memory cell array of DQ0 to DQ7 cell blocks and an ECC cell block, and an ECC circuit according to example embodiments discussed herein. The ECC cell block stores parity bits associated with fail cells in the DQ0 to DQ7 cell blocks. The ECC circuit selectively performs ECC on a bit line or a word line of a fail cell according to a command or a control signal input to each of the plurality of DRAM chips 1702.

The ECC circuit detects the location of an error bit and corrects data of the error bit based on the parity bits associated with a corresponding fail cell.

The buffer chips 1704 store a result of testing the characteristics of the plurality of DRAM chips 1702 connected to the plurality of buffer chips 1704. The buffer chips 1704 manage the operations of the DRAM chips 1702 based on the stored result, thereby reducing influences on the DRAM chips 1702 due to a weak cell or a weak page. For example, each of the buffer chips 1704 may include a storage space therein to repair a weak cell or a weak page in the DRAM chips 1702.

Referring to FIG. 21, a memory module 1800 includes a printed circuit board 1801, a plurality of DRAM chips 1802, a connector 1803, a plurality of buffer chips 1804, and a controller 1805. The controller 1805 communicates with the plurality of DRAM chips 1802 and the plurality of buffer chips 1804. The controller 1805 also controls operating modes of the DRAM chips 1802. The controller 1805 may control various functions, characteristics, and modes using mode registers (not shown) of the DRAM chip 1802.

Although not shown, in this example each of the DRAM chips 1802 includes a memory cell array of DQ0 to DQ7 cell blocks, an ECC cell block, and an ECC circuit according to example embodiments discussed herein. The ECC cell block stores parity bits associated with fail cells in the DQ0 to DQ7 cell blocks.

The ECC circuit selectively performs ECC on a bit line or a word line of a fail cell according to a command or a control signal input to each of the plurality of DRAM chips 1802. The ECC circuit detects the location of an error bit and corrects data of the error bit based on the parity bits associated with a corresponding fail cell.

The memory modules 1600, 1700, and 1800 may be embodied as any of various memory modules (e.g., a single in-line memory module (SIMM), a dual in-line memory module (DIMM), a small-outline DIMM (SO-DIMM), an unbuffered DIMM (UDIMM), a fully-buffered DIMM (FB-DIMM), a rank-buffered DIMM (RBDIMM), a load-reduced DIMM (LRDIMM), a mini-DIMM, a micro-DIMM, etc.).

Figure 22:
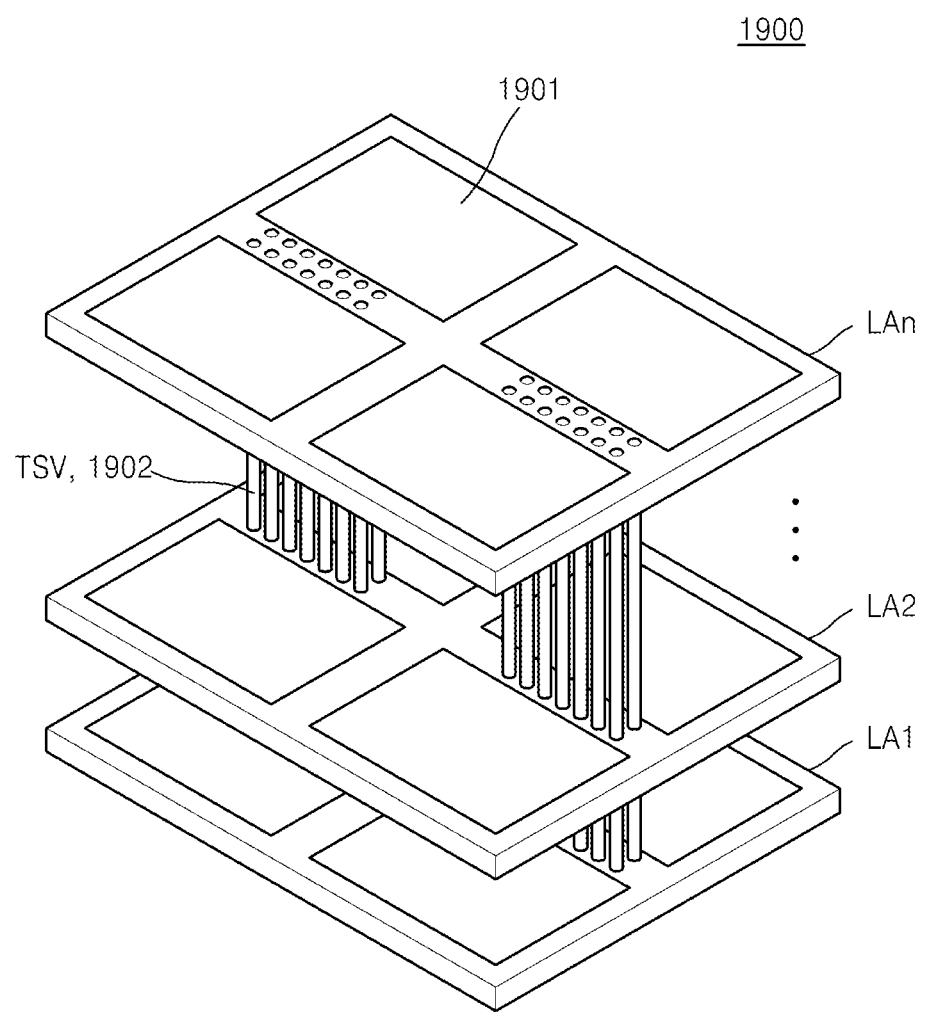
FIG. 22 illustrates an example embodiment of a semiconductor device having a stacked structure of DRAM semiconductor layers configured to perform selective ECC.

FIG. 22 illustrates an example embodiment of a semiconductor device 1900 having a stacked structure of DRAM semiconductor layers for performing selective ECC.

Referring to FIG. 22, the semiconductor device 1900 includes a plurality of DRAM semiconductor layers LA1 to LAn. Each of the plurality of DRAM semiconductor layers LA1 to LAn may be a memory chip including memory cell arrays 1901 with DRAM cells. Some of the plurality of DRAM semiconductor layers LA1 to LAn may be master chips that interface with an external controller, and the other DRAM semiconductor layers may be slave chips that store data. In FIG. 22, a lowermost semiconductor layer LA1 may be a master chip, and the other semiconductor layers LA2 to LAn may be slave chips.

The plurality of DRAM semiconductor layers LA1 to LAn exchange signals with one another via through-silicon vias TSV 1902. The master chip LA1 may communicate with an external memory controller (not shown) via a conductive unit (not shown) formed on an external surface thereof.

Signals may be exchanged among the plurality of DRAM semiconductor layers LA1 to LAn through an optical I/O connection (e.g., a radiative manner using radio frequency (RF) waves or ultrasound waves, an inductive coupling manner using magnetic induction, a non-radiative manner using oscillation of a magnetic field, etc.).

In the radiative manner, signals are wirelessly transmitted using an antenna, such as a monopole antenna or a planar inverted-F antenna (PIFA). Radiation occurs as electric fields or magnetic fields that change according to time are influenced by each other. When antennas using the same or substantially the same frequency are present, a signal may be received according to polarization characteristics of an incident wave.

In the inductive coupling manner, a relatively strong magnetic field is generated in one direction by winding a coil several times, and coupling is caused by disposing a coil that oscillates at a frequency similar or substantially similar to that of the wound coil to be adjacent to the wound coil. The non-radiative manner employs evanescent wave coupling to move electromagnetic waves between two media oscillating at the same or substantially the same frequency through a near-field electric field.

Although not shown, in this example each of the plurality of DRAM semiconductor layers LA1 to LAn includes a memory cell array of DQ0 to DQ7 cell blocks, an ECC cell block, and an ECC circuit according to example embodiments discussed herein. The ECC cell block stores parity bits associated with fail cells in the DQ0 to DQ7 cell blocks. The ECC circuit selectively performs ECC on a bit line or a word line of a fail cell according to a command or a control signal input to the plurality of DRAM semiconductor layers LA1 to LAn. The ECC circuit detects the location of an error bit based on the parity bits of a corresponding fail cell, and corrects data of the error bit.

In the memory modules 1600 to 1800 of FIGS. 19 to 21, each of the DRAM chips may include the plurality of DRAM semiconductor layers LA1 to LAn.

Figure 23:
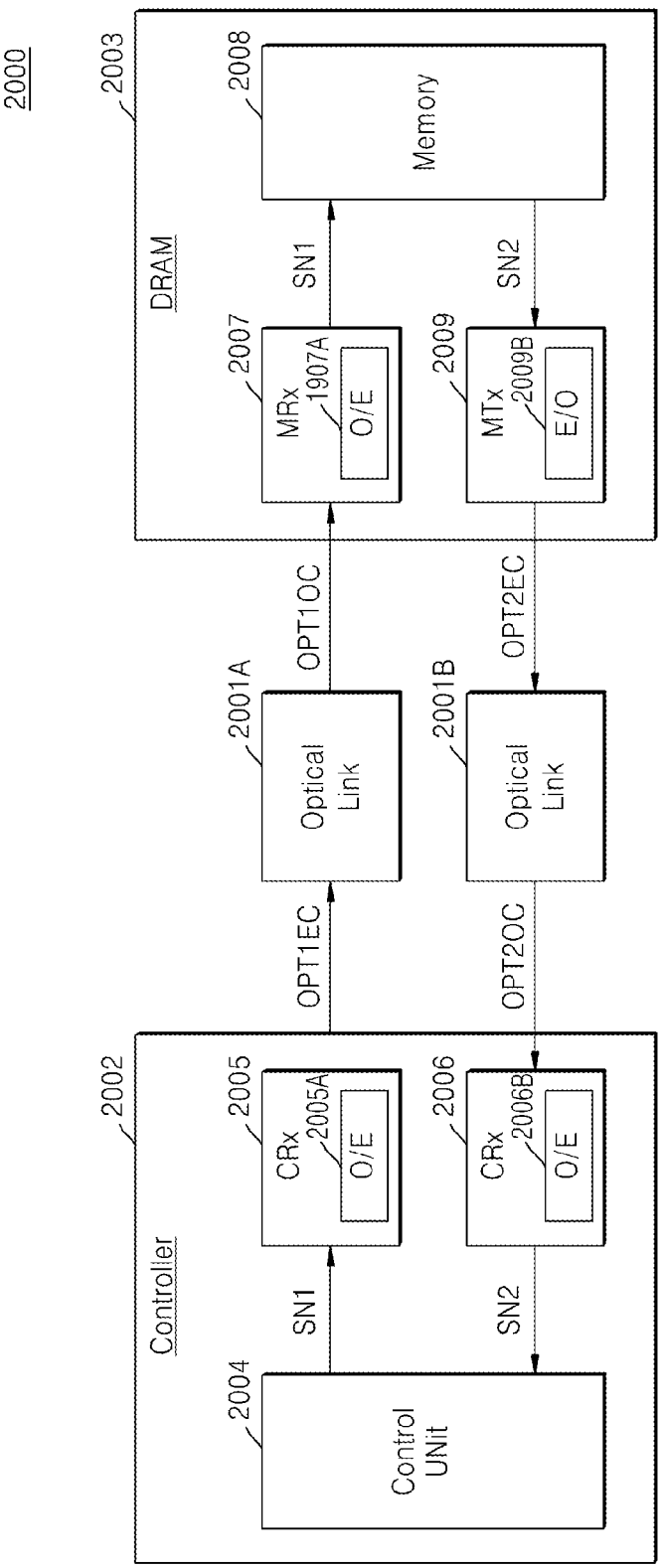
FIG. 23 is a block diagram of an example embodiment of a memory system including DRAM configured to perform selective ECC.

FIG. 23 is a block diagram of an example embodiment of a memory system 2000 including a DRAM for performing selective ECC.

Referring to FIG. 23, the memory system 2000 includes optical link devices 2001A and 1901B, a controller 2002, and DRAM 2003. The optical link devices 2001A and 1901B interconnect the controller 2002 and the DRAM 2003. The controller 2002 includes a control circuit 2004, a first transmission circuit 2005, and a first receiving circuit 2006. The control circuit 2004 transmits a first electrical signal SN1 to the first transmission circuit 2005. The first electrical signal SN1 may include, for example, command signals, clock signals, address signals, or write data to be transmitted to the DRAM 2003.

The first transmission circuit 2005 includes a first optical modulator 2005A. The first optical modulator 2005A transforms the first electrical signal SN1 into a first optical transmission signal OTP1EC, and transmits the first optical transmission signal OTP1EC to the optical link device 2001A. The first optical transmission signal OTP1EC is transmitted through serial communication via the optical link device 2001A. The first receiving circuit 2006 includes a first optical demodulator 2006B. The first optical demodulator 2006B transforms a second optical receiving signal OPT2OC received from the optical link device 2001B into a second electrical signal SN2, and transmits the second electrical signal SN2 to the control circuit 2004.

The DRAM 2003 includes a second receiving circuit 2007, a memory region 2008 including a memory cell array, and a second transmission circuit 2009.

Although not shown, in this example the memory region 2008 includes a memory cell array of DQ0 to DQ7 cell blocks, an ECC cell block, and an ECC circuit according to example embodiments discussed herein. The ECC circuit selectively performs ECC on a bit line or a word line of a fail cell, according to a command or a control signal input to each of the DRAM 2003. Based on the parity bits regarding a corresponding fail cell, the ECC circuit detects the location of an error bit and corrects data of the error bit.

The second receiving circuit 2007 includes a second optical demodulator 2007A. The second optical demodulator 2007A transforms a first optical receiving signal OPT1OC received from the optical link device 2001A into the first electrical signal SN1, and transmits the first electrical signal SN1 to the memory region 2008.

In the memory region 2008, write data is written to a memory cell according to the first electrical signal SN1, or data read from the memory region 2008 is transmitted as the second electrical signal SN2 to the second transmission circuit 2009. The second electrical signal SN2 may include, for example, a clock signal and read data to be transmitted to the memory controller 2002.

The second transmission circuit 2009 includes a second optical modulator 2009B. The second optical modulator 2009B transforms the second electrical signal SN2 into a second optical data signal OPT2EC, and transmits the second optical data signal OPT2EC to the optical link device 2001B. The second optical transmission signal OTP2EC is transmitted according to serial communication via the optical link device 2001B.

Figure 24:
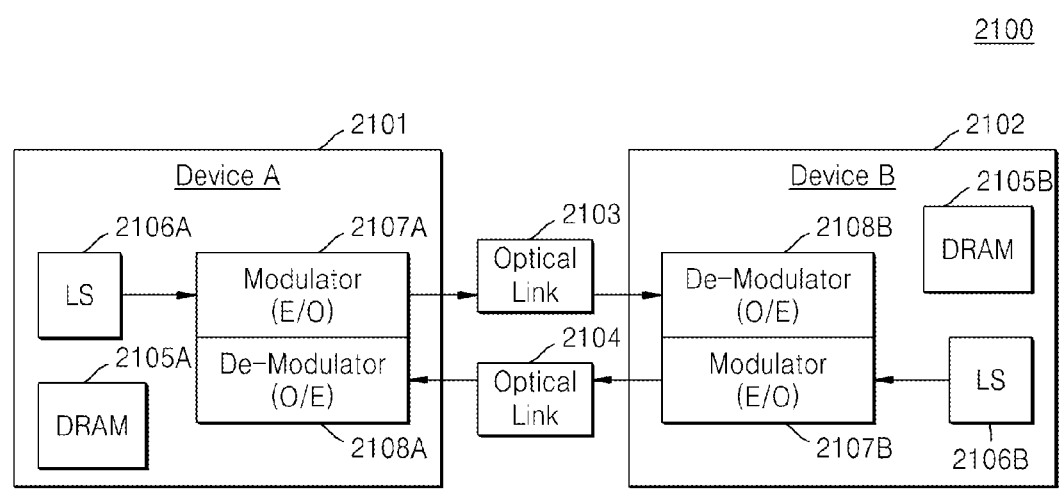
FIG. 24 is a block diagram of an example embodiment of a data processing system including DRAM configured to perform selective ECC.

FIG. 24 is a block diagram of an example embodiment of a data processing system 2100 including a DRAM for performing selective ECC.

Referring to FIG. 24, the data processing system 2100 includes a first device 2101, a second device 2102, and a plurality of optical link devices 2103 and 2104. The first device 2101 and the second device 2102 communicate optical signals with each other according to serial communication.

The first device 2101 includes DRAM 2105A, a first light source 2106A, a first optical modulator 2007A capable of performing an electric-to-optical (E/O) conversion operation, and a first optical demodulator 2008A capable of performing an optical-to-electric (O/E) conversion operation. The second device 2102 includes DRAM 2105B, a second light source 2106B, a second optical modulator 2107B, and a first optical demodulator 2108B. In this example, each of the DRAMs 2105A and 2105B includes a memory cell array of DQ0 to DQ7 cell blocks, an ECC cell block, and an ECC circuit according to example embodiments discussed herein. The ECC cell block stores parity bits associated with fail cells in the DQ0 to DQ7 cell blocks. The ECC circuit selectively performs ECC on a bit line of or a word line of a fail cell according to a command or a control signal input to the DRAMs 2105A and 2105B. Based on the parity bits associated with a corresponding fail cell, the ECC circuit detects the location of an error bit and corrects data of the error bit.

The first and second light sources 2106A and 2106B output optical signals having continuous waveforms. The first and second light sources 2106A and 2106B may each be a distributed feed-back laser diode (DFB-LD), which is a multi-wavelength light source or a fabry perot laser diode (FP-LD).

The first optical modulator 2107A transforms transmission data into an optical transmission signal, and transmits the optical transmission signal to the optical link device 2103. The first optical modulator 2107A modulates a wavelength of an optical signal received from the first light source 2106A based on transmission data. The first optical demodulator 2108A receives an optical signal received from the second optical modulator 2107B of the second device 2102 via the optical link device 2104, demodulates the optical signal, and outputs a demodulated electrical signal.

The second optical modulator 2107B transforms transmission data received from the second device 2102 into an optical transmission signal, and transmits the optical transmission signal to the optical link device 2104. The second optical modulator 2107B modulates a wavelength of an optical signal received from the second light source 2106B based on transmission data. The second optical demodulator 2108B receives an optical signal received from the first optical modulator 2107A of the first device 2101 via the optical link device 2103, demodulates the optical signal, and outputs a demodulated electrical signal.

Figure 25:
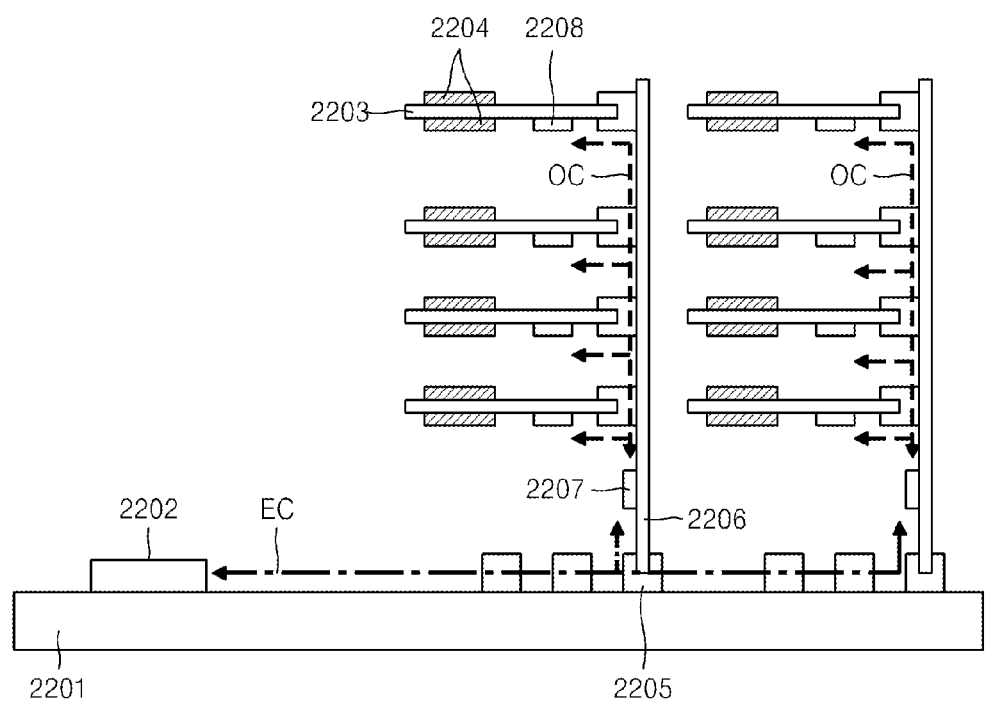
FIG. 25 illustrates an example embodiment of a server system including DRAM configured to perform selective ECC.

FIG. 25 illustrates an example embodiment of a server system 2200 including a DRAM for performing selective ECC.

Referring to FIG. 25, the server system 2200 includes a memory controller 2202 and a plurality of memory modules 2203. Each of the plurality of memory modules 2203 includes a plurality of DRAM chips 2204. Although not shown, in this example each of the DRAM chips 2204 includes a memory cell array of DQ0 to DQ7 cell blocks, an ECC cell block, and an ECC circuit according to example embodiments discussed herein. The ECC cell block stores parity bits associated with fail cells in the DQ0 to DQ7 cell blocks. The ECC circuit selectively performs ECC on a bit line or a word line of a fail cell according to a command or a control signal input to the DRAM chips 2204. Based on the parity bits associated with a corresponding fail cell, the ECC circuit detects the location of an error bit and corrects data of the error bit.

The server system 2200 may have a structure in which a second printed circuit board 2206 is combined with sockets 2205 on a first printed circuit board 2201. The server system 2200 may be designed to have a channel structure in which one second printed circuit board 2206 is connected to the first printed circuit board 2201 in units of signal channels. However, example embodiments are not limited thereto, and the server system 2200 may have any of other various structures.

Signals may be exchanged among the memory modules 2203 through an optical I/O connection. For the optical I/O connection, the server system 2200 may further include an E/O conversion circuit 2207, and each of the memory modules 2203 may further include an O/E conversion circuit 2208.

The memory controller 2202 is connected to the E/O conversion circuit 2207 via an electrical channel EC. The E/O conversion circuit 2207 transforms an electrical signal received from the memory controller 2202 via the electrical channel EC into an optical signal, and transmits the optical signal to an optical channel OC. Also, the E/O conversion circuit 2207 transforms an optical signal received via the optical channel OC into an electrical signal and transmits the electrical signal to the electrical channel EC.

The memory module 2203 is connected to the E/O conversion circuit 2207 via the optical channel OC. An optical signal supplied to the memory module 2203 may be transformed into an electrical signal through the O/E conversion circuit 2208 and the electrical signal may then be transmitted to the DRAM chips 2204. The server system 2200 including the optical link memory modules as described above is capable of supporting a high storage capacity and high-speed processing.

Figure 26:
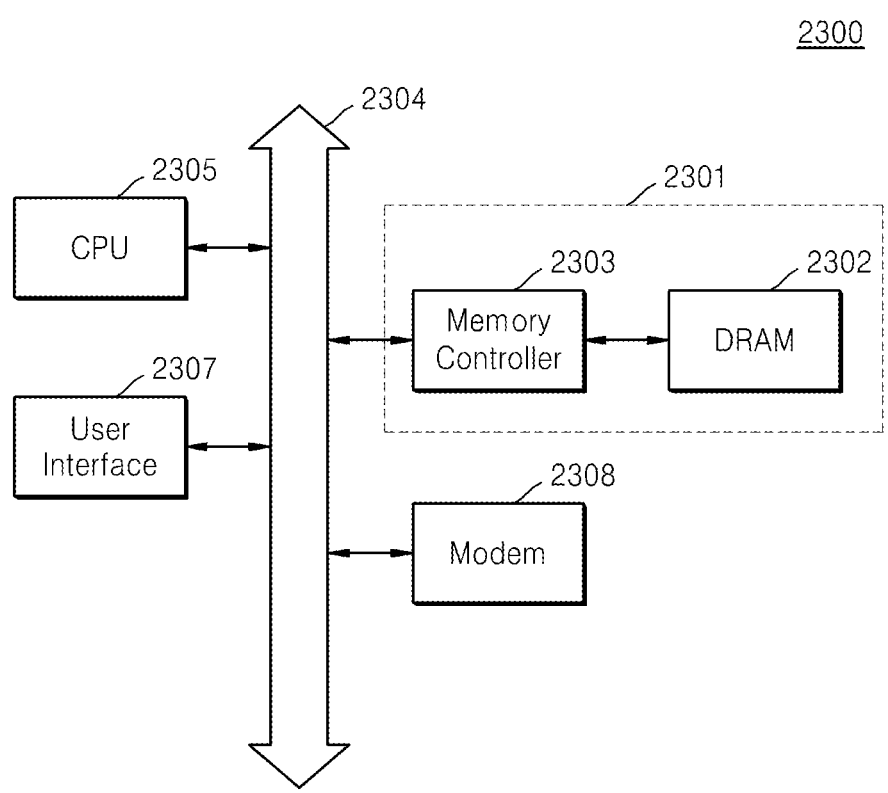
FIG. 26 is a block diagram of an example embodiment of a computer system including DRAM configured to perform selective ECC.

FIG. 26 is a block diagram of an example embodiment of a computer system 2300 including DRAM 2302 for performing selective ECC.

Referring to FIG. 26, the computer system 2300 may be mounted into a mobile device, a desktop computer, etc. The computer system 2300 may include a DRAM memory system 2301, a central processing unit (CPU) 2305, a user interface 2307, and a modem 2308, such as a baseband chipset, that are electrically connected via a system bus 2304. The computer system 2300 may further include an application chipset, a camera image processor (CIS), an I/O device, etc.

The user interface 2307 may be an interface via which data is transmitted to or received from a communication network. The user interface 2307 may be a wired/wireless type or may include an antenna or a wired/wireless transceiver. Data that is provided via the user interface 2307 or the modem 2308 or that is processed by the CPU 2305 may be stored in the DRAM memory system 2301.

The DRAM memory system 2301 includes the DRAM 2302 and a memory controller 2303. In the DRAM 2302, data that is processed by the CPU 2305 or that is input from the outside is stored. Although not shown, in this example the DRAM 2302 includes a memory cell array of DQ0 to DQ7 cell blocks, an ECC cell block, and an ECC circuit according to example embodiments discussed herein. The ECC cell block stores parity bits regarding fail cells in the DQ0 to DQ7 cell blocks. The ECC circuit selectively performs ECC on a bit line of or a word line of a fail cell according to a command or a control signal input to the DRAM 2302. Based on the parity bits associated with a corresponding fail cell, the ECC circuit detects the location of an error bit and corrects data of the error bit.

If the computer system 2300 is equipment for establishing wireless communication, the computer system 2300 may be used in a communication system, such as code division multiple access (CDMA), global system for mobile communication (GSM), north american digital cellular (NADC), and CDMA2000. The computer system 2300 may be mounted into an information processing apparatus, such as a personal digital assistant (PDA), a portable computer, a web tablet, a digital camera, a portable media player (PMP), a mobile phone, a wireless phone, a laptop computer, etc.

In general, a system separately includes a cache memory having a high operating speed and a storage unit, such as RAM, which is used to store a relatively large amount of data. In contrast, one DRAM system according to one or more example embodiments may be replaced with the memories described above. In other words, for example, a memory device including a DRAM according to one or more example embodiments is capable of rapidly storing relatively large amounts of data, thereby simplifying a computer system structure.

While the inventive concepts have been particularly shown and described with reference to example embodiments thereof, it will be understood that various changes in form and details may be made therein without departing from the spirit and scope of the following claims.

What is claimed is:

1. An error correction apparatus, comprising:
   an error correction circuit configured to selectively perform error correction on only a portion of data that is at least one of written to and read from a plurality of memory cells of a memory device, the portion of the data being determined by a comparison between fail cell address information and received address information;
   wherein the error correction circuit includes
      an error correction coding circuit configured to selectively perform error correction on the data, and
      a control logic circuit configured to control the error correction coding circuit in response to the comparison between the fail cell address information and the received address information;
   wherein the control logic circuit includes
      a comparator circuit configured to output a match signal based on the comparison between the fail cell address information and the received address information; and
   wherein the error correction coding circuit is configured to selectively perform error correction based on the match signal.

2. The apparatus of claim 1, wherein the portion of the data is at least one of written to and read from a subset of the plurality of memory cells, and wherein the subset includes at least one fail cell among the plurality of memory cells, the apparatus further including,
   a fail address storage circuit configured to store the fail cell address information for the at least one fail cell.

3. The apparatus of claim 2, wherein the error correction circuit is configured to update memory cells as fail cells using electrical fuse programming.

4. The apparatus of claim 3, wherein the electrical fuse is an anti-fuse.

5. The apparatus of claim 1, wherein the fail cell address information includes a fail cell row address and a fail cell column address, and the received address information includes a received row address and a received column address for a memory cell from among the plurality of memory cells, and wherein the comparator circuit comprises:
   a first comparator configured to output a row match signal based on a comparison between the fail cell row address and the received row address, and
   a second comparator configured to output the match signal based on a comparison between the fail cell column address and the received column address.

6. The apparatus of claim 5, wherein the first comparator is further configured to output a fail cell column position signal based on the comparison between the fail cell row address and the received row address, and wherein the apparatus further includes,
   a fail cell column address table configured to output the fail cell column address based on the row match signal and the fail cell column position signal.

7. The apparatus of claim 1, wherein the error correction coding circuit is configured to selectively perform the error correction based on the match signal and an instruction signal, the instruction signal indicating whether a received command is a read command or a write command.

8. The apparatus of claim 7, wherein the error correction coding circuit is configured to read the data from the memory device and to perform the error correction on the read data if the received command is the read command and the match signal indicates that the received address information matches the fail cell address information.

9. The apparatus of claim 7, wherein the error correction coding circuit is configured to generate an error correction parity code based on the data if the received command is the write command and the match signal indicates that the received address information matches the fail cell address information, and wherein the error correction coding circuit is further configured to store the error correction parity code and the data in the memory device.

10. The apparatus of claim 1, wherein the error correction coding circuit is configured to selectively perform the error correction on at least two fail cells connected to a same word line of the memory device.

11. An error correction apparatus, comprising:
an error correction circuit configured to selectively perform error correction on only a portion of data that is at least one of written to and read from a plurality of memory cells of a memory device, the portion of the data being determined by a comparison between fail cell address information and received address information;
wherein the error correction circuit includes
an error correction coding circuit configured to selectively perform error correction on the data, and
a control logic circuit configured to control the error correction coding circuit in response to the comparison between the fail cell address information and the received address information wherein the control logic circuit includes
a comparator circuit configured to output a match signal and an error correction column address based on the comparison between the fail cell address information and the received address information; and
wherein the error correction coding circuit is configured to selectively perform error correction based on the match signal and the error correction column address.

12. The apparatus of claim 11, wherein the fail cell address information includes a fail cell row address and a fail cell column address, and the received address information includes a received row address and a received column address for a memory cell from among the plurality of memory cells, and wherein the comparator circuit includes,
a first comparator configured to output a row match signal based on a comparison between the fail cell row address and the received row address, and
a second comparator configured to output the match signal and the error correction column address based on a comparison between the fail cell column address and the received column address.

13. The apparatus of claim 11, further comprising:
an error correction column decoder configured to select error correction cells of an error correction cell block to utilize in performing the error correction based on the error correction column address.

14. The apparatus of claim 13, wherein the error correction coding circuit is configured to selectively perform the error correction based on the match signal, the error correction column address and an instruction signal, the instruction signal indicating whether a received command is a read command or a write command.

15. The apparatus of claim 14, wherein the error correction coding circuit is configured to,
read the data from memory cells of the memory device,
read error correction parity code from the selected error correction cells of the error correction cell block, and
perform the error correction on the read data based on the read error correction parity code if the received command is the read command and the match signal indicates that the received address information matches the fail cell address information.

16. The apparatus of claim 14, wherein the error correction coding circuit is configured to,
generate an error correction parity code based on the data if the received command is the write command and the match signal indicates that the received address information matches the fail cell address information,
store the data in the memory device, and
store the error correction parity code in the selected error correction cells of the error correction cell block.

17. The apparatus of claim 13, wherein the error correction cell block includes a plurality of error correction sub blocks, and wherein the error correction column decoder is further configured to select the error correction cells from the plurality of error correction sub blocks to perform the error correction.

18. An error correction apparatus of claim 7, comprising:
an error correction circuit configured to selectively perform error correction on only a portion of data that is at least one of written to and read from a plurality of memory cells of a memory device, the portion of the data being determined by a comparison between fail cell address information and received address information;
wherein the error correction circuit includes
an error correction coding circuit configured to selectively perform error correction on the data, and
a control logic circuit configured to control the error correction coding circuit in response to the comparison between the fail cell address information and the received address information;
wherein the control logic circuit includes
an address storage table configured to store the fail cell address information, the address storage table being further configured to output the fail cell address information in response to the received command,
a comparator circuit configured to output first and second comparison signals based on the received address information and the fail cell address information output from the address storage table, and
a logic unit configured to output a match signal based on the first and second comparison signals; and
wherein the error correction coding circuit is configured to perform selective error correction based on the match signal.

19. The apparatus of claim 18, wherein the received address information includes a received row address and a received column address, and the fail cell address information includes a fail cell row address and a fail cell column address, and wherein the comparator circuit includes
a first comparator configured to output the first comparison signal based on a comparison between the received row address and the fail cell row address; and
a second comparator configured to output the second comparison signal based on a comparison between the received column address and the fail cell column address.

20. The apparatus of claim 18, wherein the address storage table is further configured to store error correction column address information for error correction cells of the memory device, the address storage table being further configured to output an error correction column address for an error correction cell in response to the received command, and wherein the control logic circuit is configured to perform selective error correction coding based on the match signal and the error correction column address.

* * * * *